United States Patent
Lee et al.

(10) Patent No.: US 12,389,576 B2
(45) Date of Patent: Aug. 12, 2025

(54) DISPLAY DEVICE

(71) Applicant: LG ELECTRONICS INC., Seoul (KR)

(72) Inventors: Ingyu Lee, Seoul (KR); Maengsob Ji, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 190 days.

(21) Appl. No.: 18/022,449

(22) PCT Filed: Aug. 20, 2020

(86) PCT No.: PCT/KR2020/011128
§ 371 (c)(1),
(2) Date: Feb. 21, 2023

(87) PCT Pub. No.: WO2022/039305
PCT Pub. Date: Feb. 24, 2022

(65) Prior Publication Data
US 2023/0320045 A1    Oct. 5, 2023

(51) Int. Cl.
*H05K 7/20* (2006.01)

(52) U.S. Cl.
CPC ....... *H05K 7/2099* (2013.01); *H05K 7/20336* (2013.01)

(58) Field of Classification Search
CPC ............... H05K 7/2099; H05K 7/20336
See application file for complete search history.

(56) References Cited

U.S. PATENT DOCUMENTS 10,527,355 B2 * 1/2020 Hurbi ...................... F28F 23/02
2012/0170221 A1   7/2012 Mok
(Continued)

FOREIGN PATENT DOCUMENTS

| CN | 1955812 | 5/2007 |
|---|---|---|
| JP | 2019032146 | 2/2019 |
| KR | 1020190060074 | 6/2019 |

OTHER PUBLICATIONS

PCT International Application No. PCT/KR2020/011128, International Search Report dated May 17, 2021, 4 pages.
(Continued)

*Primary Examiner* — Mukundbhai G Patel
(74) *Attorney, Agent, or Firm* — LEE, HONG, DEGERMAN, KANG & WAIMEY

(57) ABSTRACT

Disclosed is a display device. The display device of the present disclosure includes: a display panel; a frame located in a rearward direction of the display panel; a PCB which is coupled to the frame, and has a first heating element and a second heating element that are spaced apart from each other; and a vapor chamber in contact with the first heating element and the second heating element, wherein the vapor chamber includes: a first vapor chamber which contacts the first heating element, contains a first fluid, and provides a first space in which the first fluid convects; a second vapor chamber which contacts the second heating element, contains a second fluid, and provides a second space in which the second fluid convects; a coupling portion which partitions the first space and the second space at between the first vapor chamber and the second vapor chamber; a first wick which is adjacent to the coupling portion inside the first vapor chamber, and extends along the coupling portion, and through which the first fluid moves; and a second wick which is adjacent to the coupling portion inside the second vapor chamber, and extends along the coupling portion, and through which a flow path of the second fluid moves.

20 Claims, 23 Drawing Sheets

(56) References Cited

U.S. PATENT DOCUMENTS

2017/0367214 A1   12/2017   Stellman et al.
2018/0356156 A1   12/2018   Hurbi et al.
2020/0367383 A1*  11/2020   Moon ................ H05K 7/20336

OTHER PUBLICATIONS

Korean Intellectual Property Office Application No. 10-2023-7006089, Office Action dated Dec. 5, 2024, 6 pages.

* cited by examiner

DISPLAY DEVICE

CROSS-REFERENCE TO RELATED APPLICATIONS

This application is the National Stage filing under 35 U.S.C. 371 of International Application No. PCT/KR2020/011128, filed on Aug. 20, 2020, the contents of which are all incorporated by reference herein in their entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

Among them, a display device using an organic light emitting diode (OLED) has superior luminance and viewing angle compared to a liquid crystal display device, and can be implemented in an ultra-thin shape as it does not require a backlight unit.

In addition, a lot of researches have been accomplished on a structure capable of effectively removing heat generated by displaying a high-quality image in a large-screen ultra-thin display device.

For example, a vapor chamber as a heat dissipation structure applied to a display device may be used to dissipate heat from a heating element that is an element embedded in the display device and generates high-temperature heat to the outside. Accordingly, it is possible to prevent thermal damage not only to the heating element but also to electronic elements adjacent to the heating element due to a spatial restriction of display device.

DISCLOSURE

Technical Problem

The present disclosure has been made in view of the above problems, and provides a display device having a vapor chamber capable of effectively dissipating heat from a heating element to the outside while occupying a relatively small volume.

The present disclosure further provides a display device having a vapor chamber capable of dissipating heat from multiple heating elements with high efficiency.

The present disclosure further provides a display device capable of preventing thermal interference between vapor chambers through a wick structure while spatially separating and connecting vapor chambers contacting each of the multiple heating elements.

The present disclosure further provides a display device having a vapor chamber capable of avoiding contact or interference with elements excluding a heating element that is a target of heat dissipation.

Technical Solution

In an aspect, there is provided a display device including: a display panel; a frame located in a rearward direction of the display panel; a PCB which is coupled to the frame, and has a first heating element and a second heating element that are spaced apart from each other; and a vapor chamber in contact with the first heating element and the second heating element, wherein the vapor chamber includes: a first vapor chamber which contacts the first heating element, contains a first fluid, and provides a first space in which the first fluid convects; a second vapor chamber which contacts the second heating element, contains a second fluid, and provides a second space in which the second fluid convects; a coupling portion which partitions the first space and the second space at between the first vapor chamber and the second vapor chamber; a first wick which is adjacent to the coupling portion inside the first vapor chamber, and extends along the coupling portion, and through which the first fluid moves; and a second wick which is adjacent to the coupling portion inside the second vapor chamber, and extends along the coupling portion, and through which a flow path of the second fluid moves.

Advantageous Effects

Effects of the display device according to the present disclosure are described as follows.

According to at least one of the embodiments of the present disclosure, there is provided a display device having a vapor chamber capable of effectively dissipating heat from a heating element to the outside while occupying a relatively small volume.

According to at least one of the embodiments of the present disclosure, there is provided a display device having a vapor chamber capable of dissipating heat from multiple heating elements with high efficiency.

According to at least one of the embodiments of the present disclosure, there is provided a display device capable of preventing thermal interference between vapor chambers through a wick structure while spatially separating and connecting vapor chambers contacting each of the multiple heating elements.

According to at least one of the embodiments of the present disclosure, there is provided a display device having a vapor chamber capable of avoiding contact or interference with elements excluding a heating element that is a target of heat dissipation.

Further scope of applicability of the present disclosure will become apparent from the following detailed description. However, it should be understood that the detailed description and specific embodiments such as preferred embodiments of the present disclosure are given by way of illustration only, since various changes and modifications within the spirit and scope of the present disclosure may be clearly understood by those skilled in the art.

MODE FOR INVENTION

Figure 1:
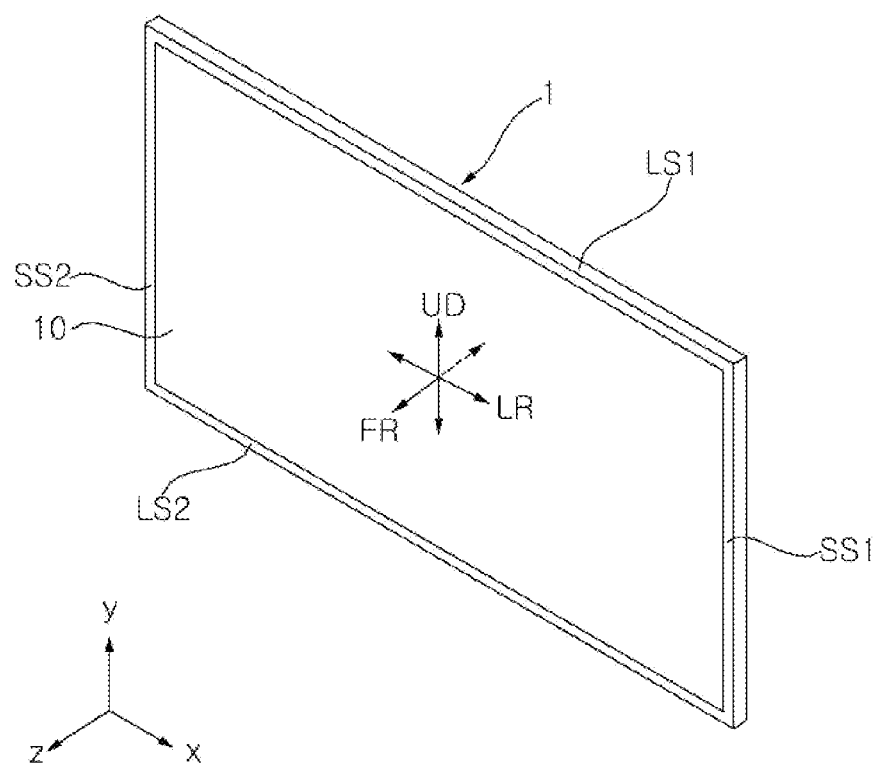
FIGS. 1 to 23 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 1 may include a display panel 10. The display panel 10 may display a screen.

The display device 1 may include a first long side LS1, a second long side LS2 facing the first long side LS1, a first short side SS1 adjacent to the first long side LS1 and the second long side LS2, and a second short side SS2 facing the first short side SS1. Meanwhile, for convenience of explanation, it is illustrated that the lengths of the first and second long sides LS1 and LS2 are longer than the lengths of the first and second short sides SS1 and SS2, but it may be possible that the lengths of the first and second long sides LS1 and LS2 are approximately the same as the lengths of the first and second short sides SS1 and SS2.

A direction parallel to the long side LS1, LS2 of the display device 1 may be referred to as a first direction DR1 or a left-right direction LR. A direction parallel to the short side SS1, SS2 of the display device 1 may be referred to as a second direction DR2 or an up-down direction UD. A direction perpendicular to the long side LS1, LS2 and the short side SS1, SS2 of the display device 1 may be referred to as a third direction DR3 or a front-rear direction FR. Here, a direction in which the display panel 10 displays a screen may be referred to as a forward direction, and a direction opposite to this may be referred to as a rearward direction.

Hereinafter, a display panel using an organic light emitting diode (OLED) will be described as an example for the display panel 10, but the display panel 10 applicable to the present disclosure is not limited thereto.

Figure 2:
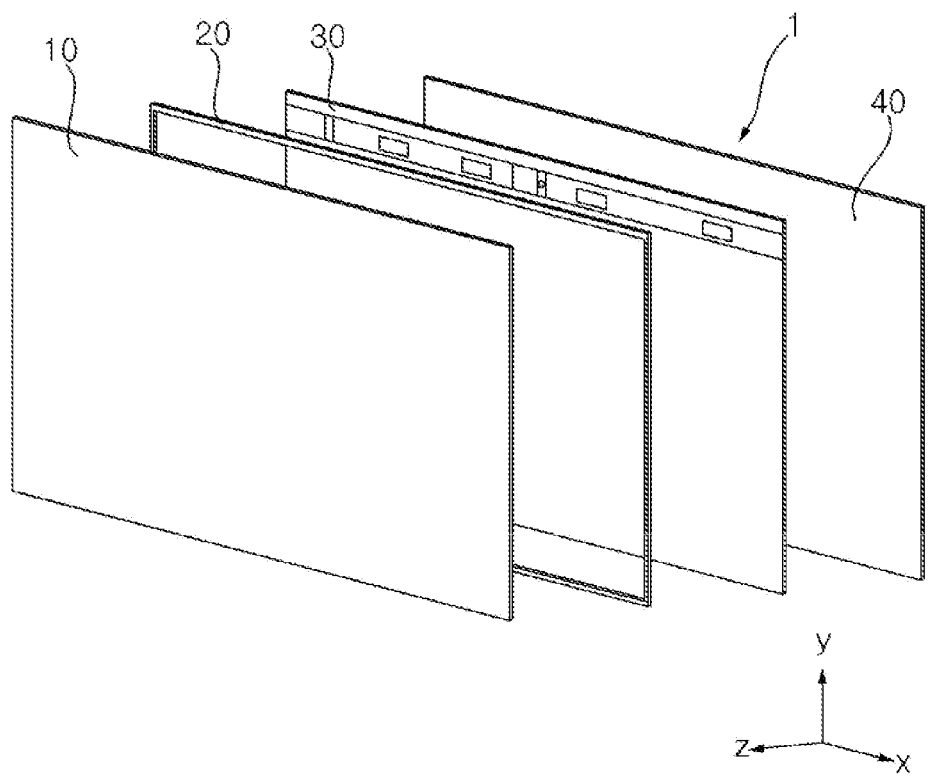

Referring to FIGS. 1 and 2, the display device 1 may include a display panel 10, a side frame 20, a frame 30, and a back cover 40.

The display panel 10 may form the front surface of the display device 1, and may display an image in a forward direction. The display panel 10 may divide an image into a plurality of pixels, and output an image by adjusting color, brightness, and saturation for each pixel. The display panel 10 may be divided into an active area in which an image is displayed and a de-active area in which an image is not displayed. The display panel 10 may generate a light corresponding to red, green, or blue color according to a control signal.

The side frame 20 may form a side surface of the display device 1. The side frame 20 may be located in a rearward direction of the display panel 10, and the display panel 10 may be coupled thereto. The side frame 20 may have a rectangular ring shape as a whole. For example, the side frame 20 may include a metal material. For example, the side frame 20 may include aluminum Al. Meanwhile, the side frame 20 may be referred to as a middle frame or a middle cabinet.

The frame 30 may be located in a rearward direction of the display panel 10. The frame 30 may be coupled to the side frame 20. In this case, the frame 30 may face the display panel 10 with the side frame 20 interposed therebetween. Meanwhile, the frame 30 may be referred to as a main frame, an inner frame, or a module cover.

The back cover 40 may form the rear surface of the display device 1. The back cover 40 may be coupled to the frame 30 to cover the rearward of the frame 30. Meanwhile, in the display device 1, the back cover 40 may omitted, and the above-described frame 30 may serve as an exterior material.

Figure 3:
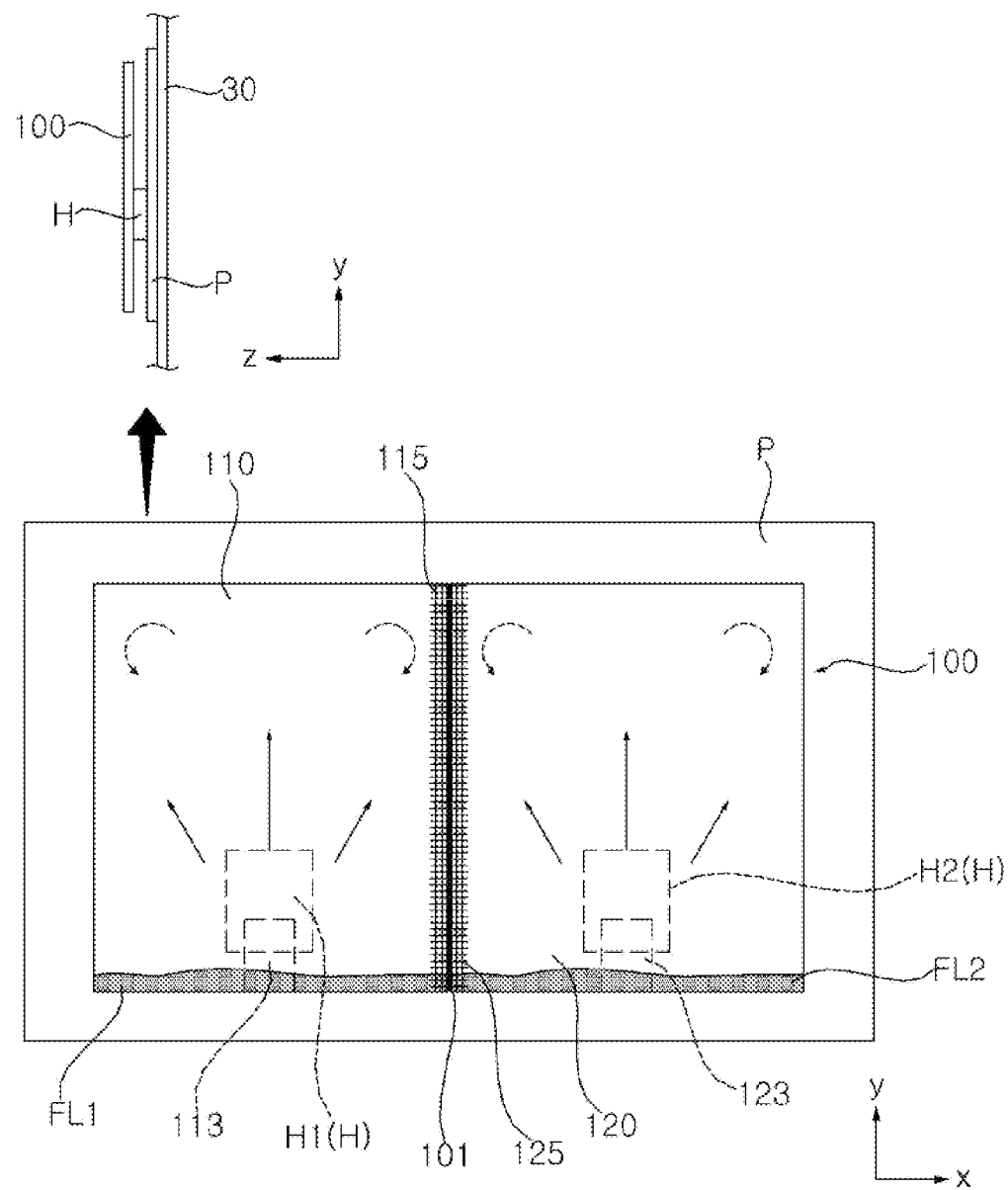

Referring to FIG. 3, various electronic components electrically connected to the display panel 10 may be installed in the frame 30. A printed circuit board PCB on which a plurality of elements are located may be coupled to the frame 30. For example, PCB(P) may be a main board. For example, the PCB(P) may be coupled to the front surface of the frame 30. Meanwhile, it is necessary to prevent thermal damage by preventing a plurality of elements mounted on the PCB(P) from being exposed to high-temperature heat, and for this purpose, the display device 1 may include a vapor chamber 100.

The vapor chamber 100 is coupled to the PCB(P) and may contact the heating element H, which is at least one element among a plurality of elements mounted on the PCB(P). Here, the heating element H may be an element that generates heat when a current flows. For example, the heating element H may be an IC chip. In this case, the vapor chamber 100 may discharge heat received from the heating element H to the outside. Accordingly, the vapor chamber 100 may prevent thermal damage to the heating element H and elements adjacent thereto by preventing the heating element H from being overheated.

Figure 4:
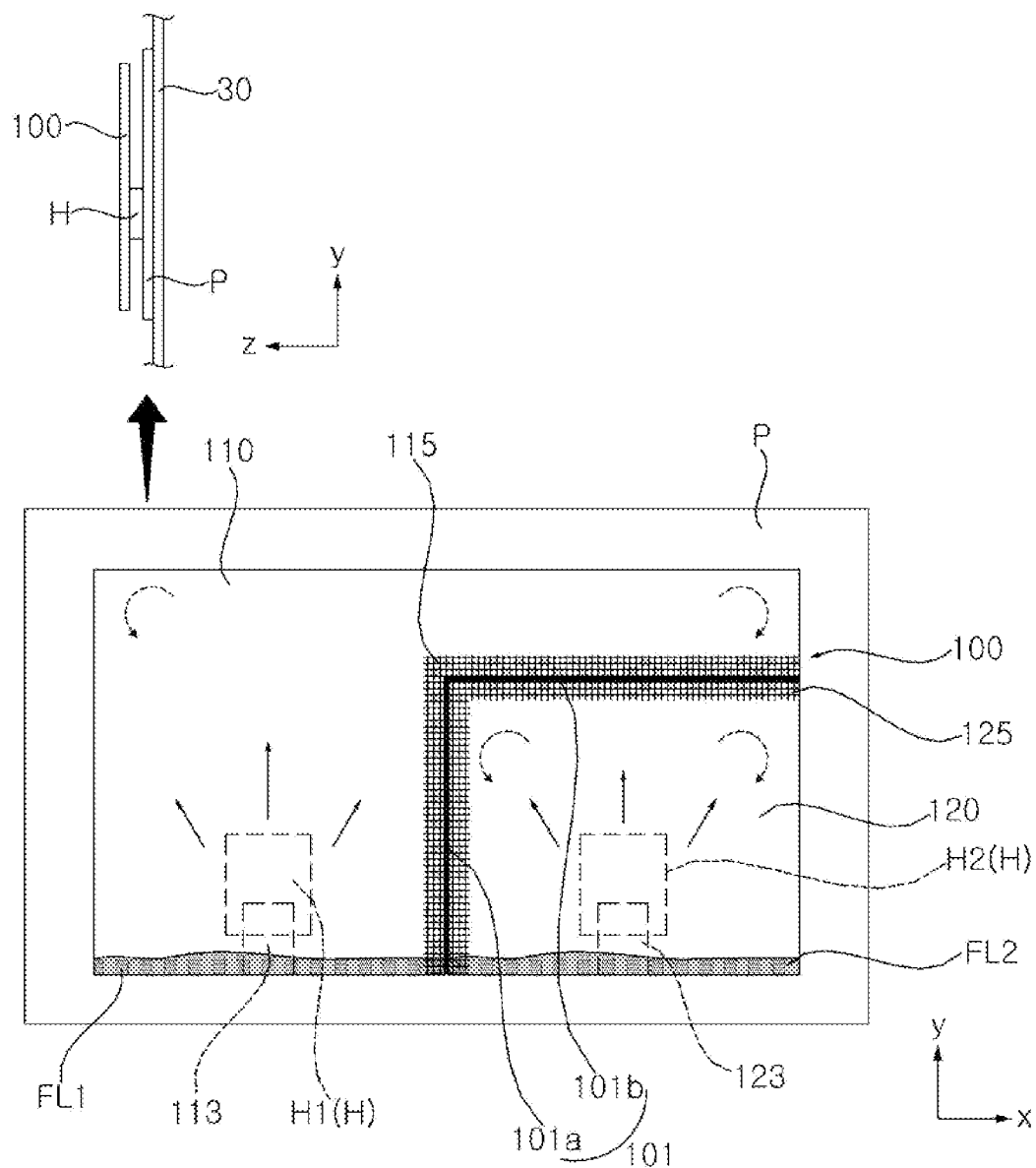

Referring to FIGS. 3 and 4, the heating element H may include a first heating element H1 and a second heating element H2 spaced apart from each other in the left-right direction. In this case, the vapor chamber 100 may include a first vapor chamber 110 having a rear surface in contact with the first heating element H1 and a second vapor chamber 120 having a rear surface in contact with the second heating element H2. Meanwhile, although two heating elements contact the vapor chamber 100 in the above and below, it is also possible that three or more heating elements contact the vapor chamber 100.

The first vapor chamber 110 and the second vapor chamber 120 may be coupled to each other by welding or brazing to form a coupling portion 101. The coupling portion 101 may partition the inner space of the first vapor chamber 110 and the inner space of the second vapor chamber 120 between the first vapor chamber 110 and the second vapor chamber 120. Meanwhile, as a single vapor chamber 100 has a partition portion (not shown) therein instead of the coupling portion 101, the inner space of the vapor chamber 100 can be partitioned into two or more spaces in response to the number of heating elements in contact with the vapor chamber 100. Meanwhile, the coupling portion 101 may be referred to as a partition portion.

Referring to FIG. 3, for example, the coupling portion 101 may extend long in the up-down direction. In this case, the first vapor chamber 110 may be located in the right side of the coupling portion 101, and the second vapor chamber 120 may be located in the left side of the coupling portion 101. Each of the first vapor chamber 110 and the second vapor chamber 120 may be formed in a rectangular shape as a whole. The area of the first vapor chamber 110 and the area of the second vapor chamber 120 may be the same.

However, it is preferable that when the heat value of the first heating element H1 in contact with the first vapor chamber 110 is larger than the heat value of the second heating element H2 in contact with the second vapor chamber 120, the area of the first vapor chamber 110 is provided larger than the area of the second vapor chamber 120 in proportion to the difference between the heat values.

For another example with reference to FIG. 4, the coupling portion 101 may include a first part 101*a* extending long in the up-down direction and a second part 101*b* extending long in the left-right direction from the upper end of the first part 101*a*. In this case, the first vapor chamber 110 may be located in the right side of the first part 101*a* while being located in the upper side of the second part 101*b*. In addition, the second vapor chamber 120 may be located in the left side of the first part 101*a* while being located in the lower side of the second part 101*b*. The area of the first vapor chamber 110 may be larger than that of the second vapor chamber 120. At this time, if the heat value of the first heating element H1 is larger than the heat value of the second heating element H2, it is preferable that the first heating element H1 contacts the first vapor chamber 110 and the second heating element H2 contacts the second vapor chamber 120.

Meanwhile, heat transferred from the first heating element H1 to the first vapor chamber 110 may evaporate a first fluid FL1 contained inside the first vapor chamber 110 (see the solid arrow in the first vapor chamber 110 of FIG. 3 or 4). Then, the evaporated first fluid FL1 moves upward, and may be condensed while radiating heat from the upper end of the first vapor chamber 110 to the outside (see the dotted arrow in the first vapor chamber 110 of FIG. 3 or 4). In addition, the condensed first fluid FL1 moves downward, and the above-described evaporation and condensation processes may be repeatedly performed to cool the first heating element H1.

Meanwhile, the heat transferred from the second heating element H2 to the second vapor chamber 120 may evaporate a second fluid FL2 contained inside the second vapor chamber 120 (see the solid arrow in the second vapor chamber 120 of FIG. 3 or 4). Then, the evaporated second fluid FL2 moves upward, and may be condensed while radiating heat from the upper end of the second vapor chamber 120 to the outside (see the dotted arrow in the second vapor chamber 120 of FIG. 3 or 4). In addition, the condensed second fluid FL2 moves downward, and the above-described evaporation and condensation processes may be repeatedly performed to cool the second heating element H2.

In comparison, when the vapor chamber in contact with at least two heating elements is not spatially separated, a gaseous fluid forms a vortex in the vapor chamber due to at least two heating elements existing in a different location, the performance of the vapor chamber may be significantly degraded. Unlike this, in the present disclosure, each of the first vapor chamber 110 and the second vapor chamber 120, which are provided to be spatially separated, may smoothly transfer the heat generated from each of the first heating element H1 and the second heating element H2 upward.

Meanwhile, the first vapor chamber 110 may include a first wick 115 which is adjacent to the coupling portion 101 and extends along the coupling portion 101. In addition, the second vapor chamber 120 may include a second wick 125 which is adjacent to the coupling portion 101 and extends along the coupling portion 101. The first wick 115 and the second wick 125 may face each other with the coupling portion 101 interposed therebetween.

In this case, the first fluid FL1 condensed in the first vapor chamber 110 may move along the first wick 115 to a first evaporation part which is a portion where the heat of the first heating element H1 is absorbed. In addition, the second fluid FL2 condensed in the second vapor chamber 120 may move along the second wick 125 to the second evaporation part which is a portion where the heat of the second heating element H2 is absorbed. At this time, the first wick 115 and the second wick 125 may move the fluid by using the surface tension and capillary action of the fluid. That is, the first wick 115 may provide a flow path for the first fluid FL1, and the second wick 125 may provide a flow path for the second fluid FL2.

For example, the first wick 115 and the second wick 125 may be formed of a thin metal mesh like a net (i.e., a wrapped screen type). For another example, the first wick 115 and the second wick 125 may be formed in a porous type (i.e., a sintered metal type) formed by sintering metal powder. This type of wick has advantages of excellent performance and easy bending. For another example, the first wick 115 and the second wick 125 may be formed of a type (i.e., an axial groove type) where a groove is formed on the inner wall of the coupling portion 101, and the fluid FL1, FL2 flows in the groove. In this case, the fluid FL1, FL2 filled in the groove forms a meniscus, and thus a capillary force may be generated. Meanwhile, various wick structures in addition to the above examples may be applied to the first wick 115 and the second wick 125.

The first wick 115 and the second wick 125 may impart directionality to heat transfer at a location adjacent to the coupling portion 101. In other words, as the condensed fluid FL1, FL2 adjacent to the coupling portion 101 is moved to the evaporation part along the first wick 115 or the second wick 125 and provided again in the above-described evaporation process, the above-described processes of evaporation and condensation of the fluid FL1, FL2 may be performed smoothly.

In comparison, if a wick structure is not provided adjacent to the coupling portion 101, heat is conducted from the vapor chamber in which relatively high-temperature heat is formed to the vapor chamber in which relatively low-temperature heat is formed through the coupling portion 101, so that the above-described fluid FL1, FL2 may not be smoothly condensed. Unlike this, as the first wick 115 and the second wick 125 are provided adjacent to the coupling portion 101 in the present disclosure, even if the heat value generated by the first heating element H1 and the heat value generated by the second heating element H2 are different from each other, it is possible to prevent heat from being conducted from one of the first vapor chamber 110 and the second vapor chamber 120 to the other one through the coupling portion 101.

Figure 5:
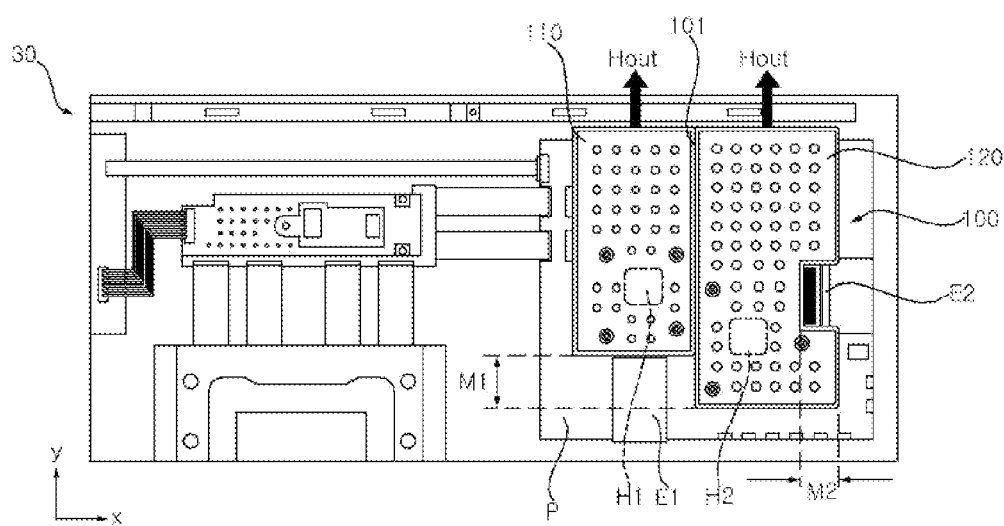

Referring to FIG. 5, the heat Hin transferred from the first heating element H1 and the second heating element H2 to the first vapor chamber 110 and the second vapor chamber 120 may move upward through the above-described processes of evaporation and condensation of the fluid FL1, FL2, and then may be discharged to the outside from the upper end of the first vapor chamber 110 and the second vapor chamber 120 (see Hout in FIG. 5).

In this case, considering the characteristic that a relatively high temperature fluid moves upward than a relatively low temperature fluid, it is preferable that a condensing part, which is a portion that dissipates heat of the first vapor chamber 110 and the second vapor chamber 120, is located above the evaporation part. For example, the upper end of the first vapor chamber 110 and the second vapor chamber 120 may be adjacent to the upper end of the frame 30. Here, the upper end of the frame 30 may be understood as a portion adjacent to the outside as a portion adjacent to the upper end of the display device 1. Accordingly, the above-described heat dissipation may be smoothly performed through the upper end of the first vapor chamber 110 and the second vapor chamber 120.

Figure 6:
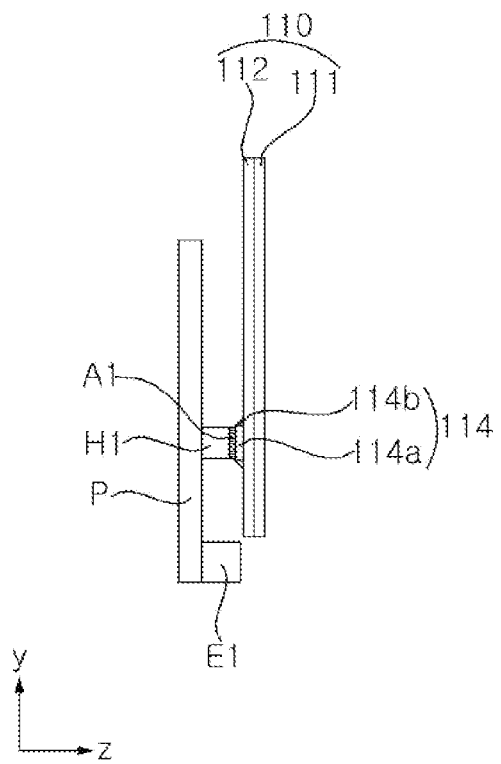

Referring to FIGS. 5 and 6, the first vapor chamber 110 may include a first front plate 111 forming the front surface of the first vapor chamber 110 and a first rear plate 112 forming a rear surface of the first vapor chamber 110. The first front plate 111 and the first rear plate 112 are coupled to each other, and may contain the first fluid FL1 (see FIG. 3) therein. For example, the first fluid FL1 may be water. For example, the first front plate 111 and the first rear plate 112 may include stainless steel or aluminum Al that has an excellent corrosion resistance.

In this case, the first heating element H1 may contact the first rear plate 112 while being coupled to the PCB(P) at between the first rear plate 112 and the PCB(P). Specifically, the first heating element H1 may contact a first heat absorbing portion 114 of the first rear plate 112. That is, heat generated from the first heating element H1 may be supplied to the first fluid FL1 through the first heat absorbing portion 114 to evaporate the first fluid FL1. In addition, since the PCB(P) or any element mounted on the PCB(P) is not in contact with a portion of the first rear plate 112 excluding the first heat absorbing portion 114, the above-described evaporation and condensation processes of the first fluid FL1 may be performed smoothly.

In addition, a first adhesive A1 may be coupled to the first heating element H1 and the first heat absorbing portion 114 at between the first heating element H1 and the first heat absorbing portion 114. At this time, since the first adhesive A1 has excellent thermal conductivity, heat generated in the first heating element H1 can be easily transferred to the first heat absorbing portion 114. For example, the first adhesive A1 may be a double-sided tape.

Meanwhile, a first protruding element E1 may be mounted on the PCB(P) at the lower side of the first heating element H1 and protrude forward. In this case, the lower end of the first vapor chamber 110 is spaced apart to the upper side of the first protruding element E1, so that the first vapor chamber 110 may not be interfered with by the first protruding element E1. That is, even if the first protruding element E1 is provided as a heating element, as the first vapor chamber 110 is spaced apart without contacting the first protruding element E1, the above-described evaporation and condensation processes of the first fluid FL1 may be performed smoothly.

Figure 7:
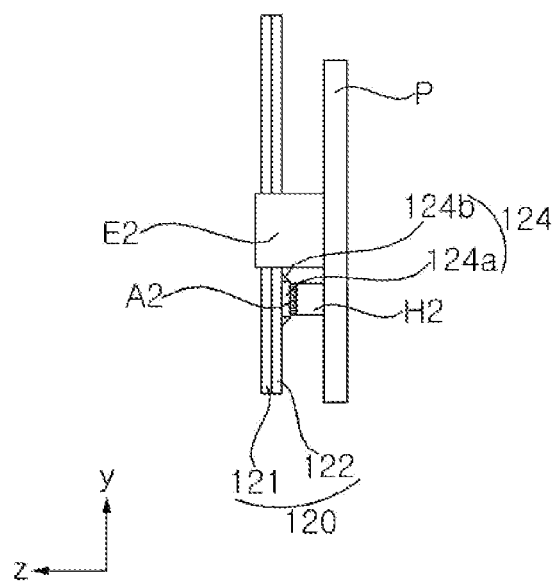

Referring to FIGS. 5 and 7, the second vapor chamber 120 may include a second front plate 121 forming the front surface of the second vapor chamber 120 and a second rear plate 122 forming the rear surface of the second vapor chamber 120. The second front plate 121 and the second rear plate 122 are coupled to each other, and may contain a second fluid FL2 (see FIG. 3) therein. For example, the second fluid FL2 may be water. For example, the second front plate 121 and the second rear plate 122 may include stainless steel or aluminum Al that has an excellent corrosion resistance.

In this case, the second heating element H2 may contact the second rear plate 122 while being coupled to the PCB(P) at between the second rear plate 122 and the PCB(P). Specifically, the second heating element H2 may contact a second heat absorbing portion 124 of the second rear plate 122. That is, heat generated by the second heating element H2 may be supplied to the second fluid FL2 through the second heat absorbing portion 124 to evaporate the second fluid FL2. In addition, since the PCB(P) or any element mounted on the PCB(P) is not in contact with a portion of the second rear plate 122 excluding he second heat absorbing portion 124, the above-described processes of evaporation and condensation of the second fluid FL2 may be performed smoothly.

In addition, the second adhesive A2 may be coupled to the second heating element H2 and the second heat absorbing portion 124 at between the second heating element H2 and the second heat absorbing portion 124. At this time, the second adhesive A2 has excellent thermal conductivity, so that heat generated in the second heating element H2 can be easily transferred to the second heat absorbing portion 124. For example, the second adhesive A2 may be a double-sided tape.

Meanwhile, a second protruding element E2 may be mounted on the PCB P in the left side and the upper side of the second heating element H2 and protrude in a forward direction. In this case, the left surface of the second vapor chamber 120 may be spaced apart from the second protruding element E2 so that the second vapor chamber 120 may not be interfered with by the second protruding element E2. For example, a part of the left side surface of the second vapor chamber 120 may be formed to surround a part of the side surface of the second protruding element E2. That is, even if the second protruding element E2 is provided as a heating element, as the second vapor chamber 120 is spaced apart without contacting the second protruding element E2, the above-described processes of evaporation and condensation of the second fluid FL2 may be performed smoothly.

Figure 8:
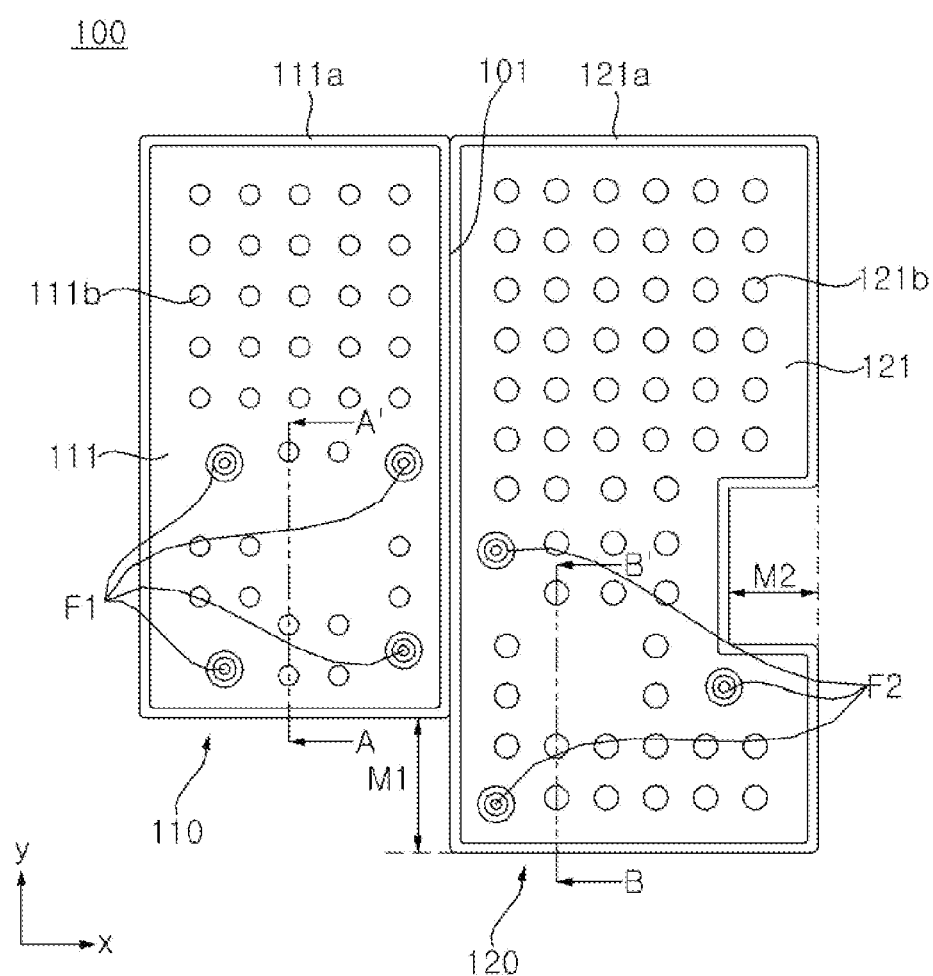
Figure 9:
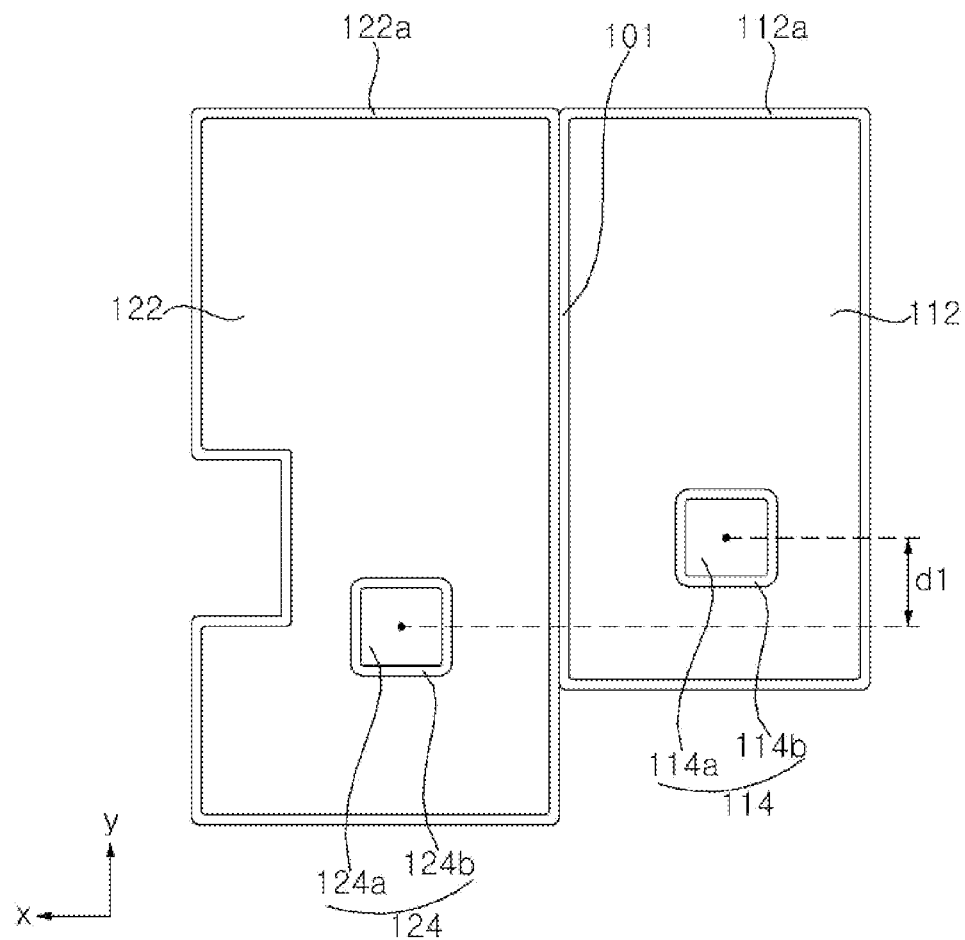
Figure 10:
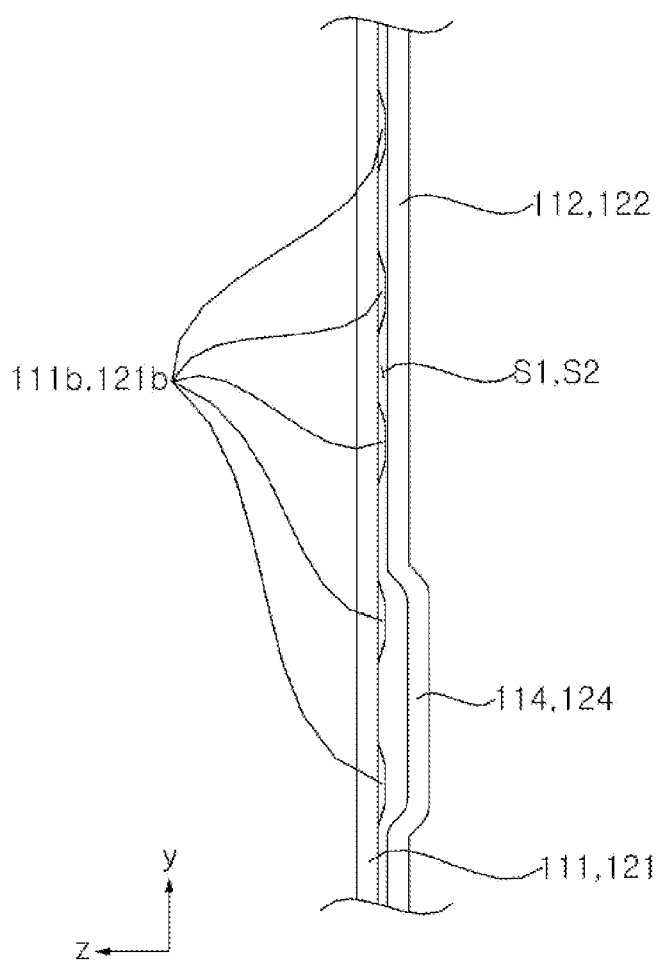

Referring to FIGS. 8 to 10, the lower end of the first vapor chamber 110 is located above the lower end of the second vapor chamber 120 by a certain distance M1, thereby avoiding a contact with the above-described first protruding element E1. In addition, a part of the left side surface of the second vapor chamber 120 is recessed to the right by a certain depth M2, thereby avoiding a contact with the above-described second protruding element E2.

The first front plate 111 and the first rear plate 112 of the first vapor chamber 110 may have the same outline as a whole. In addition, the second front plate 121 and the second rear plate 122 of the second vapor chamber 120 may have the same outline as a whole.

A first front flange 111a formed along the circumference of the first front plate 111 and a first rear flange 112a formed along the circumference of the first rear plate 112 may be coupled to each other by welding or the like. A second front flange 121a formed along the circumference of the second front plate 121 and a second rear flange 122a formed along the circumference of the second rear plate 122 may be coupled to each other by welding or the like. In addition, the above-described coupling portion 101 may be formed between the flange of the first vapor chamber 110 and the flange of the second vapor chamber 120.

Meanwhile, a plurality of first recessed portions 111b may be formed on the surface of the first front plate 111. In addition, a plurality of second recessed portions 121b may be formed on the surface of the second front plate 121. For example, the plurality of first recessed portions 111b and the plurality of second recessed portions 121b may be formed in an embossed shape.

In this case, the plurality of first recessed portions 111b come into contact with the inner surface of the first rear plate 112 to form a first space S1 between the first front plate 111 and the first rear plate 112. At this time, the above-described first fluid FL1 may be contained in the first space S1, and may convect while being evaporated into a gas phase or condensed into a liquid phase in the first space S1. In addition, the plurality of second recessed portions 121b contact the inner surface of the second rear plate 122 to form a second space S2 between the second front plate 121 and the second rear plate 122. At this time, the above-described second fluid FL2 may be contained in the second space S2, and may convect while being evaporated into a gas phase or condensed into a liquid phase in the second space S2. Meanwhile, the plurality of first recessed portions 111b may be referred to as a plurality of first spacers, and the plurality of second recessed portions 121b may be referred to as a plurality of second spacers.

Meanwhile, the first rear plate 112 may include a first heat absorbing portion 114 which is formed flat as a whole, and protrudes in a rearward direction from the first rear plate 112. In addition, the second rear plate 122 may include a second heat absorbing portion 124 which is formed flat as a whole, and protrudes in a rearward direction from the second rear plate 122.

Figure 11:
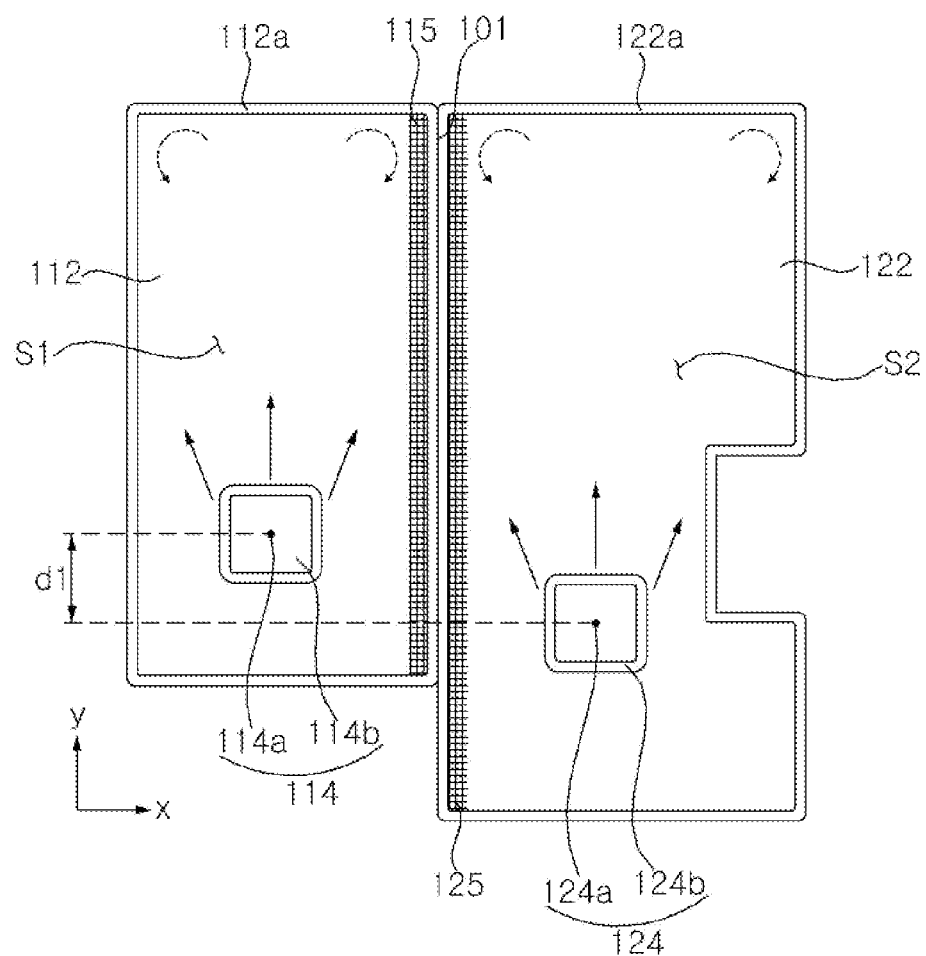

Referring to FIG. 11, the center of the first heat absorbing portion 114 may be located above the center of the second heat absorbing portion 124 by a certain distance d1. However, it is also possible that in the up-down direction, the center of the first heat absorbing portion 114 and the center of the second heat absorbing portion 124 are located parallel to each other, or the center of the first heat absorbing portion 114 is located lower than the center of the second heat absorbing portion 124.

The first wick 115 may be coupled to the right side surface of the coupling portion 101 and extend long in the up-down direction along the coupling portion 101. In addition, the second wick 125 may be coupled to the left side surface of the coupling portion 101 and extend long in the up-down direction along the coupling portion 101.

Accordingly, the first fluid FL1 contained in the first space S1 may be evaporated and moved upward by the heat of the first heating element H1 transferred through the first heat absorbing portion 114, and the second fluid FL2 contained in the second space S2 may be evaporated and moved upward by the heat of the second heating element H2 transferred through the second heat absorbing portion 124 (see the solid line arrow in FIG. 11).

In addition, the first fluid FL1 is condensed while being adjacent to the upper end of the first space S1 and flows downward again. In particular, the first fluid FL1 condensed while being adjacent to the coupling portion 101 may flow downward along the first wick 115 (see dotted arrow in FIG. 11). In addition, the second fluid FL2 is condensed while being adjacent to the upper end of the second space S2 and flows downward again. In particular, the second fluid FL2 condensed while being adjacent to the coupling portion 101 may flow downward along the second wick 125 (see dotted arrow in FIG. 11).

That is, without thermal interference such as heat conduction through the coupling portion 101, each of the first vapor chamber 110 and the second vapor chamber 120 may be used to effectively dissipate heat of each of the first heating element H1 and the second heating element H2.

Meanwhile, the size of the first space S1 in which the first fluid FL1 flows may be smaller than the size of the second space S2 in which the second fluid FL2 flows. It is preferable that such a shape of the vapor chamber is applied when the heat value of the first heating element H1 is smaller than the heat value of the second heating element H2. Furthermore, it is preferable that the size of the first space S1 is smaller than the size of the second space S2 in proportion to a difference between the heat value of the first heating element H1 and the heat value of the second heating element H2.

Figure 12:
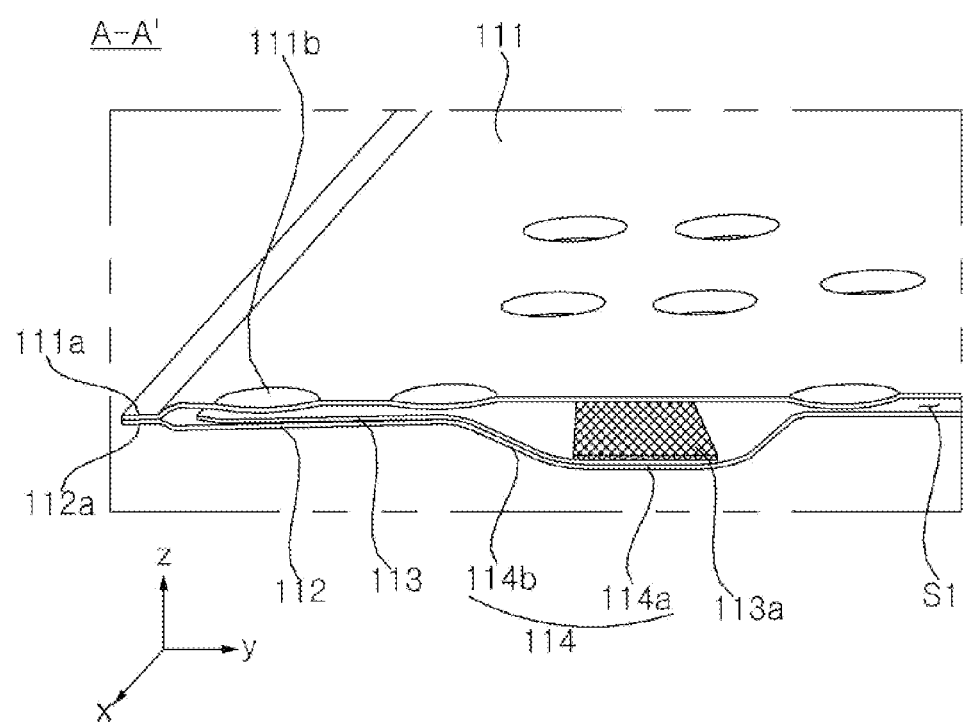

Referring to FIG. 12, the first heat absorbing portion 114 may be spaced upward from the lower end of the first vapor chamber 110 (for reference, FIG. 12 is a view taken along line A-A' of FIG. 8). For example, the first heat absorbing portion 114 may be spaced upward from the lower end of the first vapor chamber 110 by the location of the first heating element H1, the size and shape of the first vapor chamber 110, the location, size, and shape of the elements mounted on the PCB(P), etc.

In this case, the first vapor chamber 110 may include a first sheet 113. The first sheet 113 may move the liquid first fluid FL1 adjacent to the lower end of the first vapor chamber 110 to the first heat absorbing portion 114. To this end, the first sheet 113 extends in the up-down direction in the first space S1, one end of the first sheet 113 is adjacent to the lower end of the first vapor chamber 110, and the other end of the first sheet 113 may be adjacent to the upper end of the first heat absorbing portion 114. Accordingly, the liquid first fluid FL1 adjacent to the lower end of the first vapor chamber 110 may be moved to the first heat absorbing portion 114 by the first sheet 113 and evaporated.

For example, the first sheet 113 may move the liquid first fluid FL1 adjacent to the lower end of the first vapor chamber 110 to the first heat absorbing portion 114 by using capillarity. For example, the first sheet 113 may include a porous material. For example, the first sheet 113 may include a fiber material. For example, the thickness of the first sheet 113 may be about 0.5 mm. Meanwhile, the first sheet 113 may also be referred to as a micro filter.

Meanwhile, the first heat absorbing portion 114 may protrude in a rearward direction from the first rear plate 112. The first heat absorbing portion 114 may include a first seating portion 114a and a first inclined portion 114b. The first seating portion 114a may be formed flat as a whole at the rear of the first rear plate 112. The first seating portion 114a may contact the first heating element H1 (see FIG. 6). The first inclined portion 114b may be provided between the first rear plate 112 and the first seating portion 114a. The first inclined portion 114b may be inclined at an obtuse angle with respect to the first seating portion 114a.

In this case, a portion of the first sheet 113 may be seated on the first seating portion 114a via the first inclined portion 114b. Further, as the first sheet 113 is fixed between the first recessed portion 111b of the first front plate 111 and the first rear plate 112, the location of the first sheet 113 in the first space S1 may be fixed. In addition, the distance between the first sheet 113 and the first front plate 111 may be greatest at a position where the first sheet 113 is seated on the first seating portion 114a. Accordingly, the gaseous first fluid FL1 that is formed as the first fluid FL1, which is absorbed by the first sheet 113 and moved to the first seating portion 114a, is evaporated by the heat transferred from the first heating element H1 may smoothly flow through the first space S1.

Meanwhile, a first mesh 113a may be coupled to the first sheet 113 and face the first seating portion 114a with the first sheet 113 interposed therebetween. A plurality of pores may be formed in the first mesh 113a. The first mesh 113a may reduce noise generated when bubbles of the first fluid FL1 ejected through the first sheet 113 burst. That is, the size of bubbles generated when the first fluid FL1 is evaporated in the first sheet 113 by the plurality of pores of the first mesh 113a is reduced, so that the bubbles can disappear without loud noise.

For example, the first mesh 113a may be formed in a rectangular shape as a whole. For example, the first mesh 113a may include a metal material. For example, the first mesh 113a may include stainless steel having excellent corrosion resistance.

Figure 13:
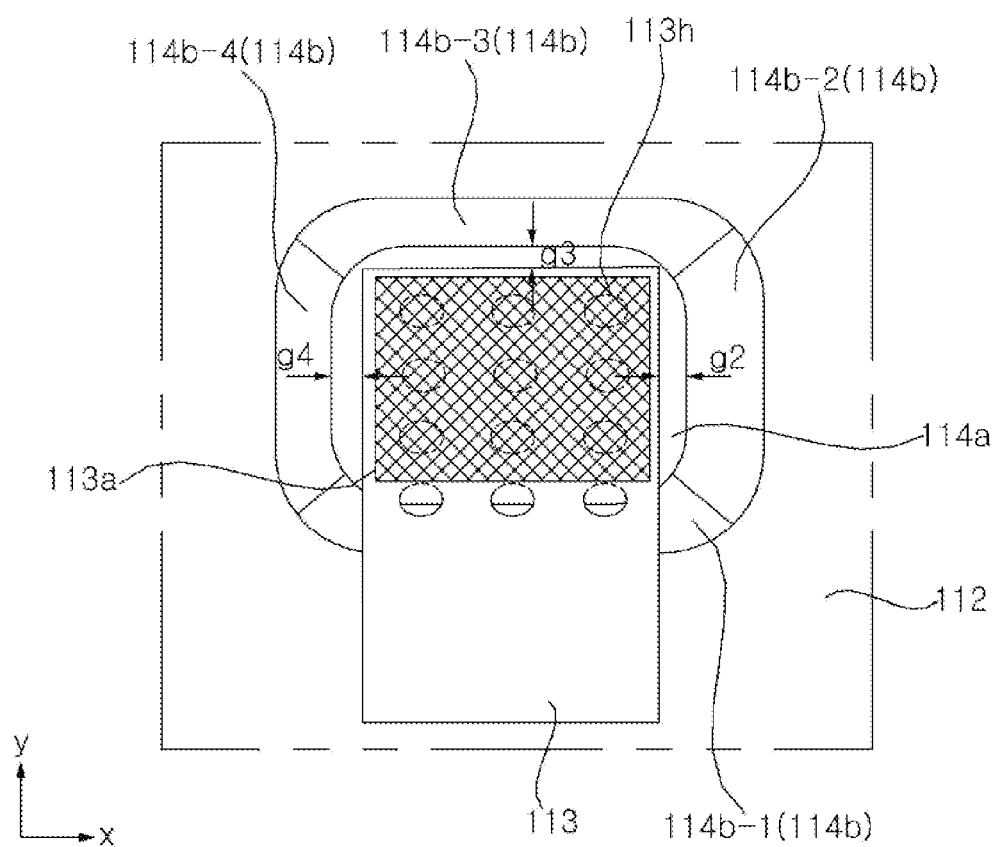

Referring to FIGS. 12 and 13, the first seating portion 114a may be formed in a rectangular shape as a whole. In this case, the first inclined portion 114b may include a first-first inclined portion 114b-1 extending from each side of the first seating portion 114a, a first-second inclined portion 114b-2, a first-third inclined portion 114b-3, and a first-fourth inclined portion 114b-4. Here, the first-first inclined portion 114b-1 may be located between the lower end and the upper end of the first sheet 113. That is, the first sheet 113 whose lower end is adjacent to the lower end of the first vapor chamber 110 extends upward and may be seated on the first seating portion 114a via the first-first inclined portion 114b-1.

The first sheet 113 may be spaced apart from the first-second inclined portion 114b-2, the first-third inclined portion 114b-3, and the first-fourth inclined portion 114b-4. For example, the left side of the first sheet 113 may be spaced apart from the first-second inclined portion 114b-2 located in the left side of the first seating portion 114a by a certain distance g2. For example, the upper side of the first sheet 113 may be spaced apart from the first-third inclined portion 114b-3 located on the upper side of the first seating portion 114a by a certain distance g3. For example, the right side of the first sheet 113 may be spaced apart from the first-fourth inclined portions 114b-4 located in the right side of the first seating portion 114a by a certain distance g4.

That is, the first sheet 113 may be seated on the first seating portion 114a while not overlapping the first-second inclined portion 114b-2, the first-third inclined portion 114b-3, and the first-fourth inclined portion 114b-4. Thus, it is possible to prevent the first sheet 113, which absorbs the first fluid FL1 and increases in volume, from narrowing a space formed between the first-second inclined portion 114b-2, the first-third inclined portion 114b-3, and the first-fourth inclined portion 114b-4, and the first front plate 111.

In addition, the distance between the first front plate 111 and the first seating portion 114a is larger than the distance between the first front plate 111 and the first inclined portion 114b. This is to secure a space in which the first fluid FL1 can smoothly flow between the first front plate 111 and the first seating portion 114a even when the volume of the first sheet 113 increases.

Accordingly, even if the volume of the first sheet 113 increases as the first fluid FL1 is absorbed, the first fluid FL1 evaporated in the first sheet 113 may flow smoothly through the first space S1. In addition, it is possible to prevent the evaporated first fluid FL1 from being stagnant in the first heat absorbing portion 114 and generating boiling noise.

Figure 14:
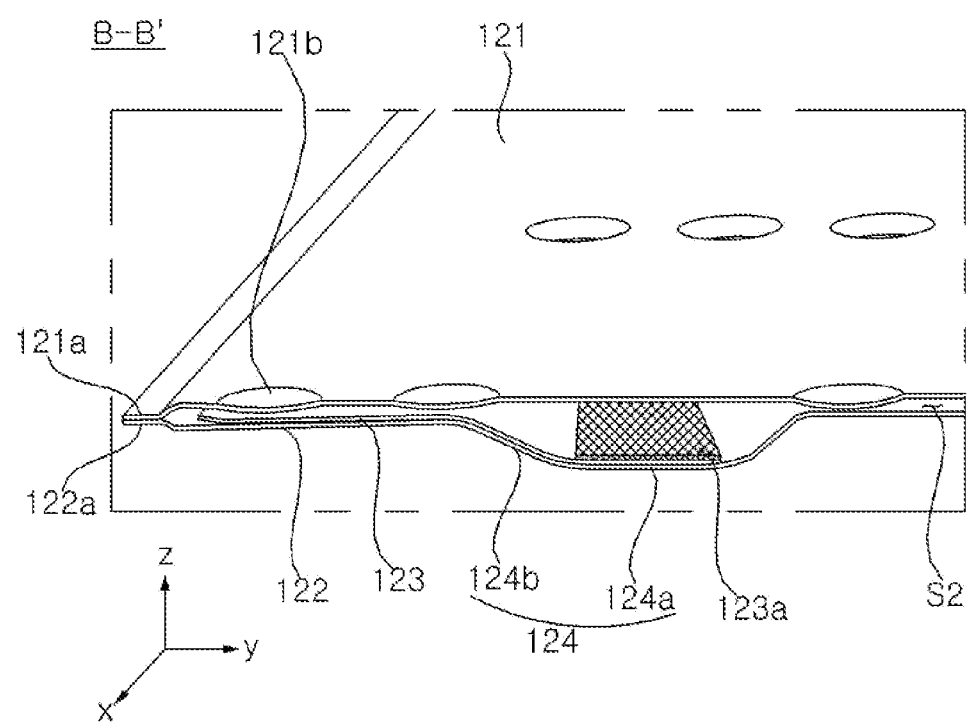

Referring to FIG. 14, the second heat absorbing portion 124 may be spaced upward from the lower end of the second vapor chamber 120 (for reference, FIG. 14 is a view taken along line B-B' of FIG. 8). For example, the second heat absorbing portion 124 may be spaced upward from the lower end of the second vapor chamber 120 by the location of the second heating element H2, the size and shape of the second vapor chamber 120, the location, size and shape of the elements mounted on the PCB(P), and the like.

In this case, the second vapor chamber 120 may include a second sheet 123. The second sheet 123 may move the liquid second fluid FL2 adjacent to the lower end of the second vapor chamber 120 to the second heat absorbing portion 124. To this end, the second sheet 123 extends in the up-down direction in the second space S2, one end of the second sheet 123 may be adjacent to the lower end of the second vapor chamber 120, and the other end of the second sheet 123 may be adjacent to the upper end of the second heat absorbing portion 124. Accordingly, the liquid second fluid FL2 adjacent to the lower end of the second vapor chamber 120 may be moved to the second heat absorbing portion 124 by the second sheet 123 and evaporated.

For example, the second sheet 123 may move the liquid second fluid FL2 adjacent to the lower end of the second vapor chamber 120 to the second heat absorbing portion 124 by using capillarity. For example, the second sheet 123 may include a porous material. For example, the second sheet 123 may include a fiber material. For example, the second sheet 123 may have a thickness of about 0.5 mm. Meanwhile, the second sheet 123 may be referred to as a micro filter.

Meanwhile, the second heat absorbing portion 124 may protrude in a rearward direction from the second rear plate 122. The second heat absorbing portion 124 may include a second seating portion 124a and a second inclined portion 124b. The second seating portion 124a may be formed flat as a whole at the rear of the second rear plate 122. The second seating portion 124a may contact the second heating element H2 (see FIG. 7). The second inclined portion 124b may be provided between the second rear plate 122 and the second seating portion 124a. The second inclined portion 124b may be inclined at an obtuse angle with respect to the second seating portion 124a.

In this case, a part of the second sheet 123 may be seated on the second seating portion 124a via the second inclined portion 124b. In addition, as the second sheet 123 is fixed between the second recessed portion 121b of the second front plate 121 and the second rear plate 122, the location of the second sheet 123 in the second space S2 may be fixed. In addition, the distance between the second sheet 123 and the second front plate 121 may be greatest at a position where the second sheet 123 is seated on the second seating portion 124a.

Accordingly, the gaseous second fluid FL2 that is formed as the second fluid FL2, which is absorbed by the second sheet 123 and moved to the second seating portion 124a, is evaporated by the heat transferred from the second heating element H2 may smoothly flow through the second space S2.

Meanwhile, a second mesh 123a may be coupled to the second sheet 123 and face the second seating portion 124a with the second sheet 123 interposed therebetween. A plurality of pores may be formed in the second mesh 123a. The second mesh 123a may reduce noise generated when bubbles of the second fluid FL2 ejected through the second sheet 123 burst. That is, the size of bubbles generated when the second fluid FL2 is evaporated in the second sheet 123 by the plurality of pores of the second mesh 123a is reduced, so that the bubbles can disappear without loud noise.

For example, the second mesh 123a may be formed in a rectangular shape as a whole. For example, the second mesh 123a may include a metal material. For example, the second mesh 123a may include stainless steel having excellent corrosion resistance.

Figure 15:
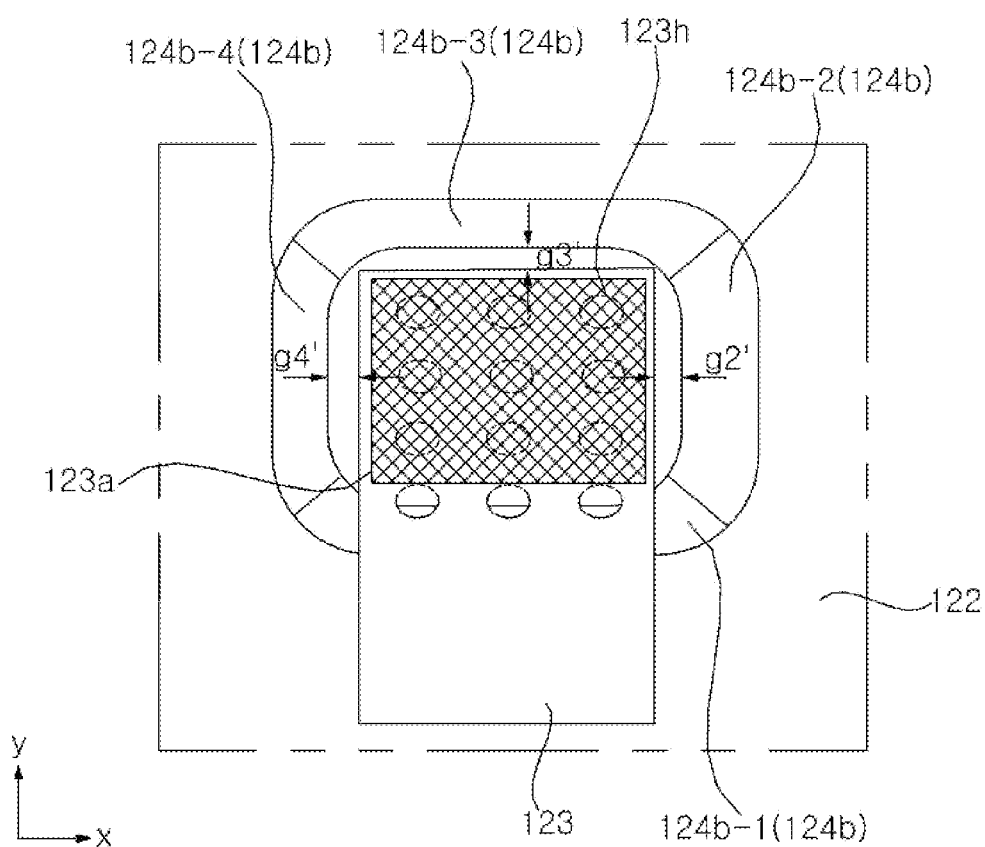

Referring to FIGS. 14 and 15, the second seating portion 124a may be formed in a rectangular shape as a whole. In this case, the second seating portion 124b may include a second-first inclined portion 124b-1 extending from each side of the second seating portion 124a, a second-second inclined portion 124b-2, a second-third inclined portion 124b-3, and a second-fourth inclined portion 124b-4. Here, the second-first inclined portion 124b-1 may be located between the lower end and the upper end of the second sheet 123. That is, the second sheet 123 whose lower end is adjacent to the lower end of the second vapor chamber 120 extends upward and may be seated on the second seating portion 124a via the second-first inclined portion 124b-1.

The second sheet 123 may be spaced apart from the second-second inclined portion 124b-2, the second-third inclined portion 124b-3, and the second-fourth inclined portion 124b-4. For example, the left side of the second sheet 123 may be spaced apart from the second-second inclined portion 124b-2 located in the left side of the second seating portion 124a by a certain distance g2'. For example, the upper side of the second sheet 123 may be spaced apart from the second-third inclined portion 124b-3 located on the upper side of the second seating portion 124a by a certain distance g3'. For example, the right side of the second sheet 123 may be spaced apart from the first-fourth inclined portions 124b-4 located in the right side of the second seating portion 124a by a certain distance g4'.

That is, the second sheet 123 may be seated on the second seating portion 124a while not overlapping the second-second inclined portion 124b-2, the second-third inclined portion 124b-3, and the second-fourth inclined portion 124b-4. Thus, it is possible to prevent the second sheet 123, which absorbs the second fluid FL2 and increases in volume, from narrowing a space formed between the second-second inclined portion 124b-2, the second-third inclined portion 124b-3, and the second-fourth inclined portion 124b-4, and the second front plate 121.

In addition, the distance between the second front plate 121 and the second seating portion 124a is larger than the distance between the second front plate 121 and the second inclined portion 124b. This is to secure a space in which the second fluid FL2 can smoothly flow between the second front plate 121 and the second seating portion 124a even when the volume of the second sheet 123 increases.

Accordingly, even if the volume of the second sheet 123 increases as the second fluid FL2 is absorbed, the second fluid FL2 evaporated in the second sheet 123 may flow smoothly through the second space S2. In addition, it is possible to prevent the evaporated second fluid FL2 from being stagnant in the second heat absorbing portion 124 and generating boiling noise.

Figure 16:
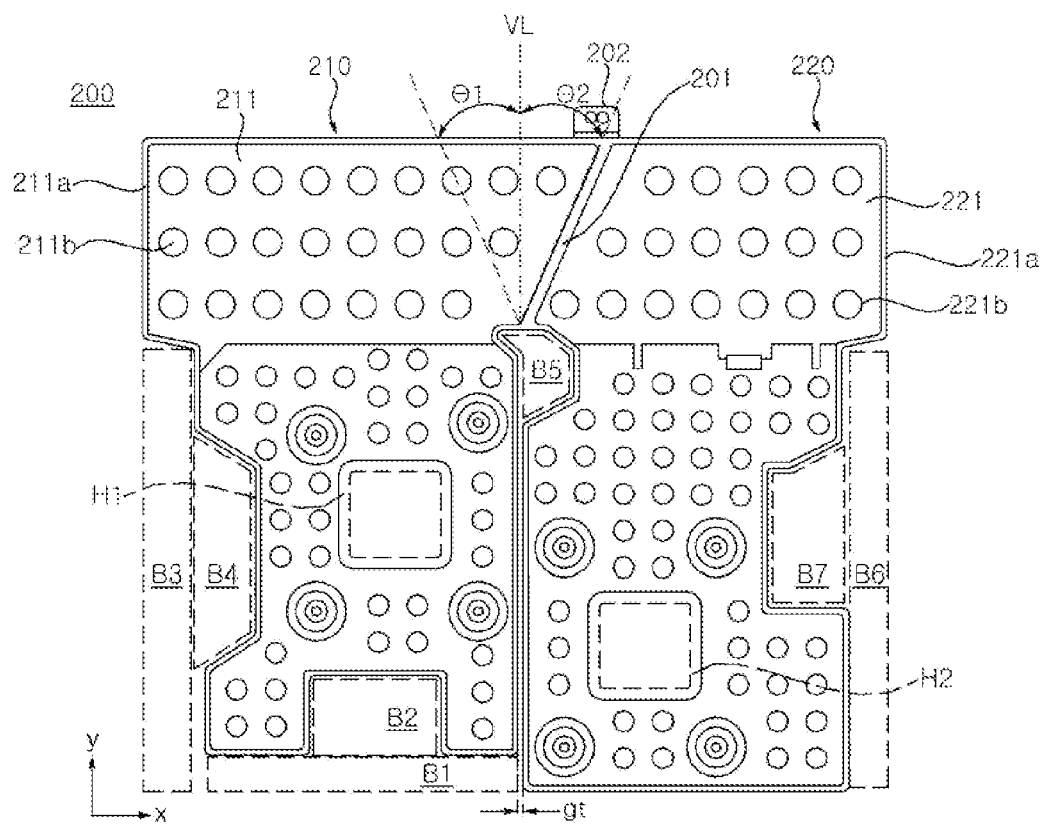
Figure 17:
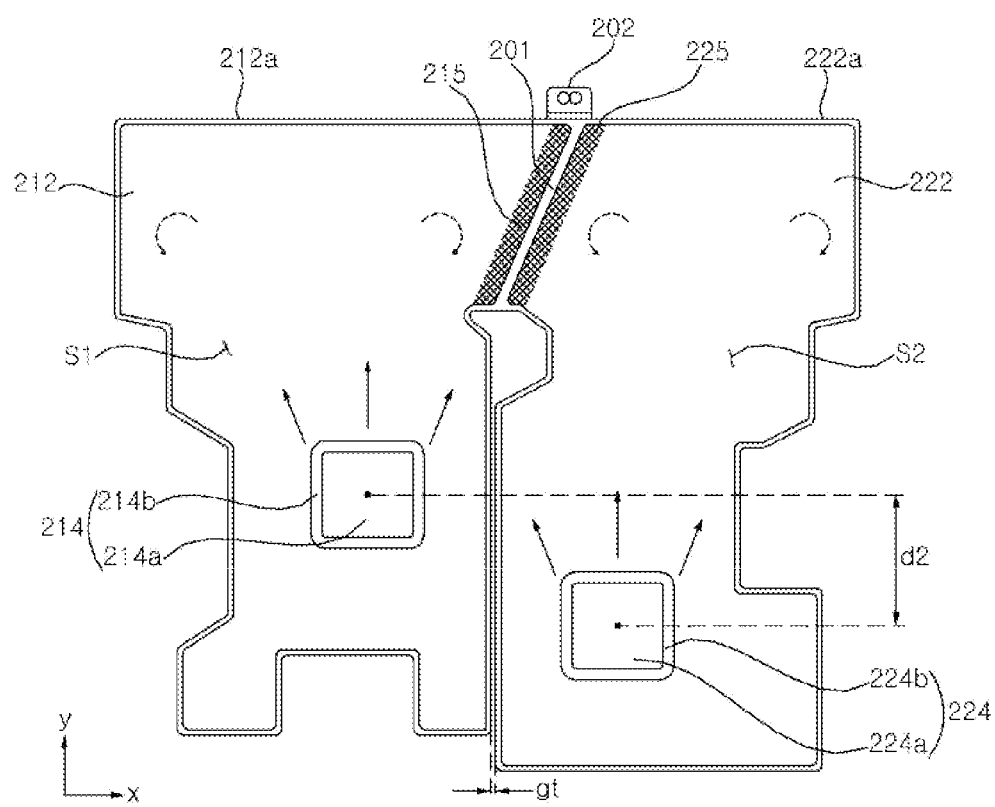

Referring to FIGS. 16 and 17, the vapor chamber 200 may contact the first heating element H1 and the second heating element H2 to dissipate the heat of the first heating element H1 and the second heating element H2. Specifically, the vapor chamber 200 may include a first vapor chamber 210 having a rear surface in contact with the first heating element H1 and a second vapor chamber 220 having a rear surface in contact with the second heating element H2.

The first vapor chamber 210 may include a first front plate 211 forming a front surface and a first rear plate 212 forming a rear surface. A first front flange 211a formed along the circumference of the first front plate 211 and a first rear flange 212a formed along the circumference of the first rear plate 212 may be coupled to each other. In addition, a plurality of first recessed portions 211b are formed on the front surface of the first front plate 211, and as the plurality of first recessed portions 211b come into contact with the first rear plate 212, a first space S1 containing the first fluid FL1 may be formed between the first front plate 211 and the first rear plate 212. In addition, the first rear plate 212 may include a first heat absorbing portion 214 that protrudes in a rearward direction from the first rear plate 212 and contacts the first heating element H1.

The second vapor chamber 220 may include a second front plate 221 forming a front surface and a second rear plate 222 forming a rear surface. A second front flange 221a formed along the circumference of the second front plate 221 and a second rear flange 222a formed along the circumference of the second rear plate 222 may be coupled to each other. In addition, a plurality of second recessed portions 221b are formed on the front surface of the second front plate 221, and as the plurality of second recessed portions 221b contact the second rear plate 222, a second space S2 containing the second fluid FL2 may be formed between the second front plate 221 and the second rear plate 222. In addition, the second rear plate 222 may include a second heat absorbing portion 224 that protrudes in a rearward direction from the second rear plate 222 and contacts the second heating element H2. For example, the center of the second heat absorbing portion 224 may be located lower than the center of the first heat absorbing portion 214 by a certain distance d2.

Meanwhile, in addition to contacting the first heating element H1 and the second heating element H2, the vapor chamber 200 does not contact any element located on the PCB(P), thereby smoothly performing the above-described processes of evaporating and condensing the fluid. To this end, the shape of the vapor chamber 200 may be formed by avoiding an avoidance target areas (B: B1, B2, B3, B4, B5, B6, B7) that is an area adjacent to the vapor chamber 200 as an area where devices mounted on the PCB(P) are located.

For example, the lower side of the first vapor chamber 210 may be spaced upward from a first avoidance target area B1, and a part of the lower side of the first vapor chamber 210 may be recessed upward to surround a part of a second avoidance target area B2. For example, a part of the right side of the first vapor chamber 210 may be spaced apart from a third avoidance target area B3 to the left, and a part of the right side of the first vapor chamber 210 may be recessed to the left to surround a part of a fourth avoidance target area B4. For example, a part of the left side of the second vapor chamber 220 may be spaced apart to the right from a sixth avoidance target area B6, and a part of the left side of the second vapor chamber 220 may be recessed to the right to surround a part of a seventh avoidance target area B7.

In addition, a fifth avoidance target area B5 may be located between the first vapor chamber 210 and the second vapor chamber 220. In this case, a part of the first vapor chamber 210 and a part of the second vapor chamber 220 may surround the fifth avoidance target area B5. At the lower side of the fifth avoidance target area B5, the first vapor chamber 210 and the second vapor chamber 220 may be spaced apart from each other by a certain distance gt in the left-right direction. In other words, the fifth avoidance target area B5 and a space in the lower side thereof may be a space which is adjacent to a coupling portion 201 and formed between the first vapor chamber 210 and the second vapor chamber 220. The first vapor chamber 210 and the second vapor chamber 220 may be coupled to each other by welding or brazing in the upper side of the fifth avoidance target area B5, thereby forming the coupling portion 201. Thus, the first space S1 which is the inner space of the first vapor chamber 210, and the second space S2 which is the inner space of the second vapor chamber 220 may be separated from each other with the coupling portion 201 interposed therebetween.

Meanwhile, the total size of the first avoidance target area B1, the second avoidance target area B2, the third avoidance target area B3, and the fourth avoidance target area B4 adjacent to the first vapor chamber 210 may be larger than the total size of the sixth avoidance target area B6 and the seventh avoidance target area B7 adjacent to the second vapor chamber 220. Meanwhile, as the inner space of the vapor chamber in which the fluid convects increases, the heating element that provides heat by contacting the vapor chamber can be easily heat-dissipated.

For example, the coupling portion 201 may be formed along a virtual vertical line VL parallel to the up-down direction. In this case, the size of the first space S1 in which the first fluid FL1 convects may be smaller than the size of the second space S2 in which the second fluid FL2 convects by less than a certain level. It is preferable that such a shape and disposition of the coupling portion 201 may be applied when the heat value generated by the first heating element H1 is smaller than the heat value of the second heating element H2 by less than a certain level.

For another example, the coupling portion 201 may be formed inclined toward the first vapor chamber 210 by a first angle (theta 1) with respect to the vertical line VL. In this case, the size of the first space S1 in which the first fluid FL1 convects may be smaller than the size of the second space S2 in which the second fluid FL2 convects by the certain level or more. It is preferable that such a shape and disposition of the coupling portion 201 may be applied when the heat value generated by the first heating element H1 is smaller than the heat value of the second heating element H2 by the certain level or more. Furthermore, as a difference between the heat value generated by the first heating element H1 and the heat value generated by the second heating element H2 increases, the first angle (theta 1) may also increase.

For another example, the coupling portion 201 may be formed inclined toward the second vapor chamber 220 by a second angle (theta 2) with respect to the vertical line VL. In this case, the size of the first space S1 in which the first fluid FL1 convects may be equal to or larger than the size of the second space S2 in which the second fluid FL2 convects. It is preferable that such a shape and disposition of the coupling portion 201 may be applied when the heating value of the first heating element H1 is equal to or larger than the heating value of the second heating element H2. Furthermore, as a difference between the heat value generated by the first heating element H1 and the heat value generated by the second heating element H2 increases, the second angle (theta 2) may also increase.

Meanwhile, the first vapor chamber 210 may include a first wick 215 which is coupled to the coupling portion 201 in the first space S1 of the first vapor chamber 210, and extends along the coupling portion 201. In addition, the second vapor chamber 220 may include a second wick 225 which is coupled to the coupling portion 201 in the second space S2 of the second vapor chamber 220, and extends along the coupling portion 201. The first wick 215 and the second wick 225 may face each other with the coupling portion 201 therebetween. Meanwhile, since there is little need to prevent thermal interference such as heat conduction in a section where the first vapor chamber 210 and the second vapor chamber 220 are spaced apart from each other by a certain distance gt, the wick structure may be omitted.

Accordingly, without thermal interference such as heat conduction through the coupling portion 201, the evaporation process of the first fluid FL1 performed in the first heat absorbing portion 214 and the condensation process of the first fluid FL1 performed while being adjacent to the upper end of the first vapor chamber 210, or the evaporation process of the second fluid FL2 performed in the second heat absorbing portion 224 and the condensation process of the second fluid FL2 performed while being adjacent to the upper end of the second vapor chamber 220 can be performed smoothly.

Figure 18:
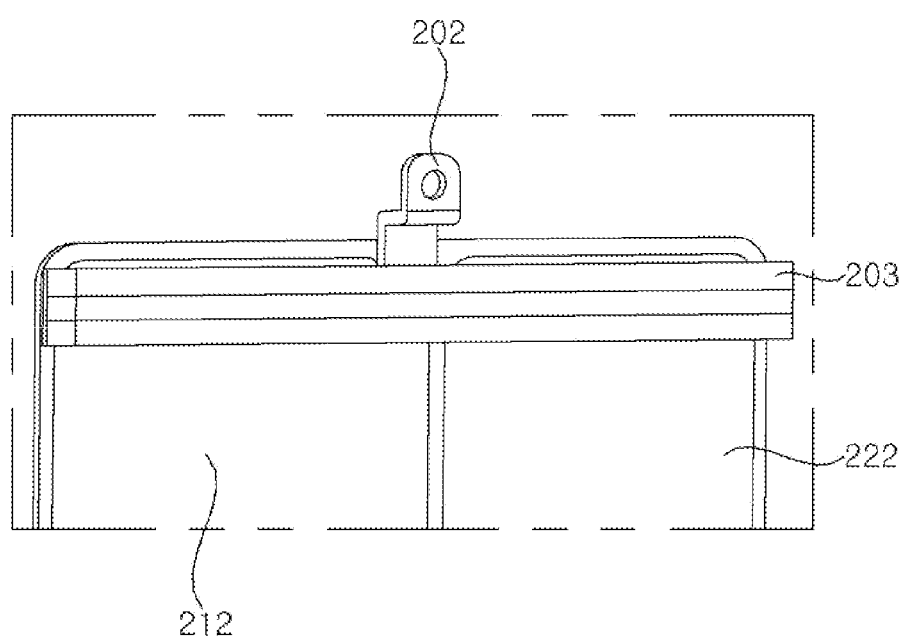
Figure 19:
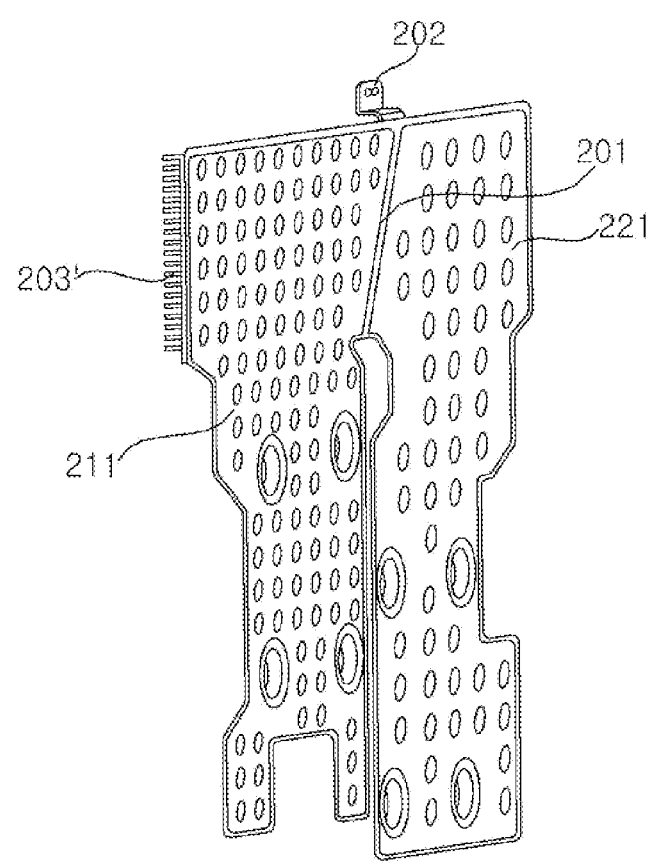

Referring to FIGS. 18 and 19, a heat sink 203, 203' may be coupled to the rear surface of the vapor chamber 200. For example, the heat sink 203, 203' may be coupled to the vapor chamber 200 through a screw (not shown), or may be coupled or attached to the vapor chamber 200 through a double-sided tape (not shown) having excellent thermal conductivity.

Referring to FIG. 18, for example, the heat sink 203 may be adjacent to the upper end of the vapor chamber 200 and coupled to the rear surface of the vapor chamber 200. In this case, the heat sink 203 may extend in the left-right direction, and be coupled to the rear surface of the first rear plate 212 and the rear surface of the second rear plate 222. The heat sink 203 may absorb heat from the vapor chamber 200. In addition, heat absorbed by the heat sink 203 may be evenly distributed throughout the heat sink 203. For example, the heat sink 203 may include a metal material. For example, the heat sink 203 may include aluminum Al.

Accordingly, thermal equilibrium between a portion adjacent to the upper end of the vapor chamber 210 and a portion adjacent to the upper end of the second vapor chamber 220 may be achieved by the heat sink 203.

Meanwhile, when the heat value of the first heating element H1 and the heat value of the second heating element H2 are different from each other, it is preferable to form a relatively large area of the vapor chamber contacting a heating element having a relatively high heat value among the first vapor chamber 210 and the second vapor chamber 220. However, due to a restriction such as the area of the PCB(P) and the size of the first heating element H1 or the second heating element H2, it may be difficult to sufficiently form the respective areas of the first vapor chamber 210 and the second vapor chamber 220 in correspondence with a difference in heat value between the first heating element H1 and the second heating element H2. In this case, as the heat sink 203 connects the first vapor chamber 210 and the second vapor chamber 220 to achieve the above described thermal equilibrium, the vapor chamber 200 can efficiently dissipate heat of the first heating element H1 and the second heating element H2.

Referring to FIG. 19, for another example, the heat sink 203' may be coupled to the rear surface of the vapor chamber 200 in an area wider than the above described heat sink 203.

In addition, the heat sink 203' includes a plurality of fins, so that heat absorbed by the heat sink 203' can be easily discharged to the outside.

Meanwhile, the heat sink 203 or the heat sink 203' may be applied not only to the vapor chamber 200, but also to the above described vapor chamber 100 and vapor chambers 300 and 400 described later.

Meanwhile, the vapor chamber 200 may be fixed to the PCB(P) by screwing a screw to the PCB(P) by penetrating the bracket 202.

Figure 20:
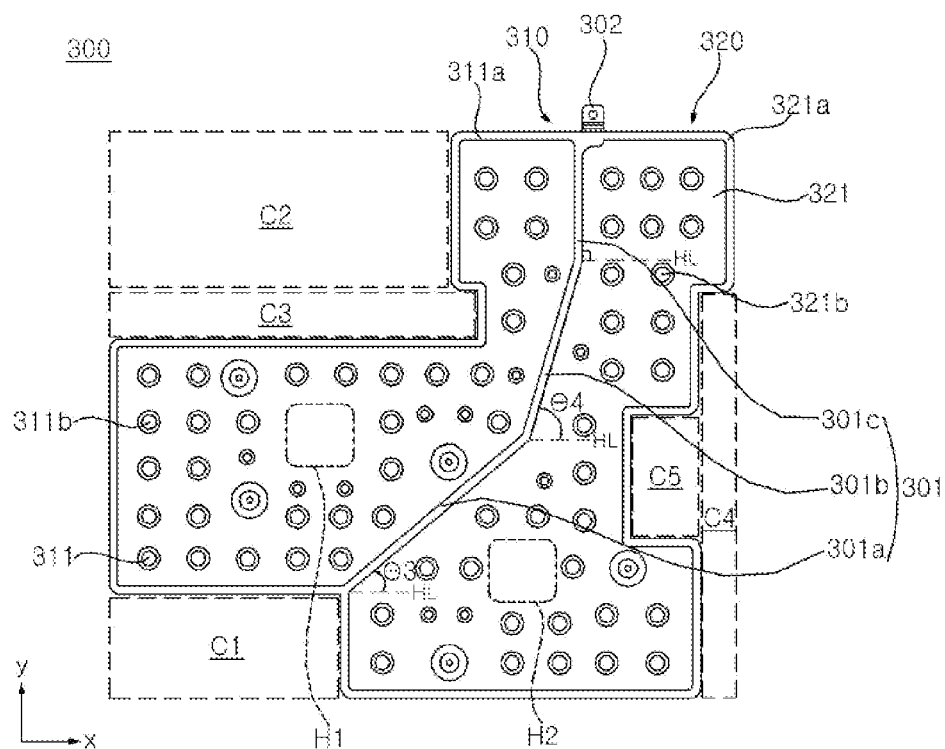
Figure 21:
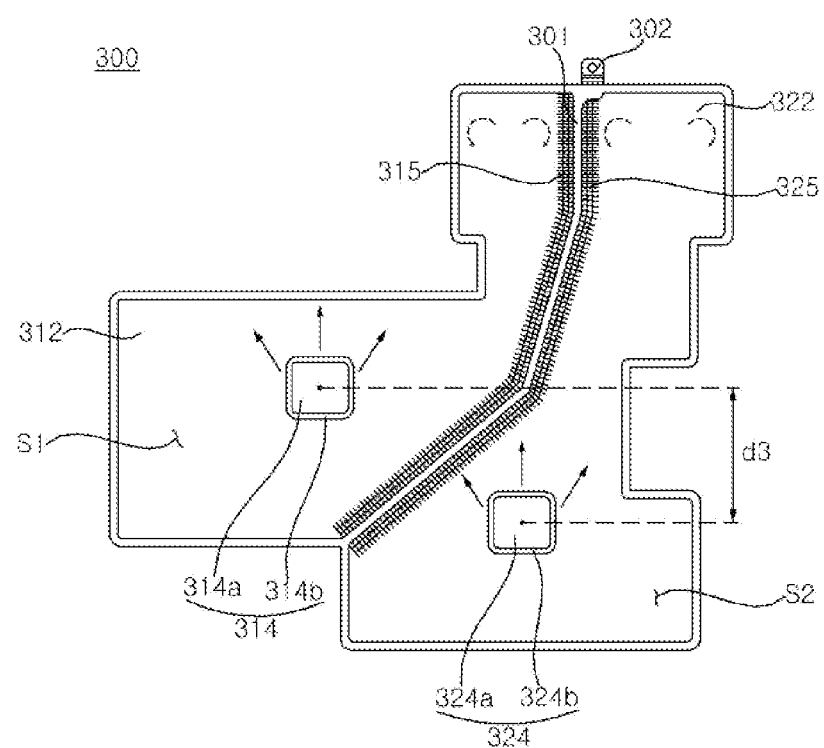

Referring to FIGS. 20 and 21, the vapor chamber 300 contacts the first heating element H1 and the second heating element H2 to dissipate heat of the first heating element H1 and the second heating element H2. Specifically, the vapor chamber 300 may include a first vapor chamber 310 having a rear surface contacting the first heating element H1 and a second vapor chamber 320 having a rear surface contacting the second heating element H2.

The first vapor chamber 310 may include a first front plate 311 forming a front surface and a first rear plate 312 forming a rear surface. A first front flange 311a formed along the circumference of the first front plate 311 and a first rear flange 312a formed along the circumference of the first rear plate 312 may be coupled to each other. In addition, a plurality of first recessed portions 311b may be formed on the front surface of the first front plate 311, and as the plurality of first recessed portions 311b come into contact with the first rear plate 312, a first space S1 containing the first fluid FL1 may be formed between the first front plate 311 and the first rear plate 312. In addition, the first rear plate 312 may include a first heat absorbing portion 314 that protrudes in a rearward direction from the first rear plate 312 and contacts the first heating element H1.

The second vapor chamber 320 may include a second front plate 321 forming a front surface and a second rear plate 322 forming a rear surface. A second front flange 321a formed along the circumference of the second front plate 321 and a second rear flange 322a formed along the circumference of the second rear plate 322 may be coupled to each other. In addition, a plurality of second recessed portions 321b may be formed on the front surface of the second front plate 321, and as the plurality of second recessed portions 321b come into contact with the second rear plate 322, a second space S2 containing the second fluid FL2 may be formed between the second front plate 321 and the second rear plate 322. In addition, the second rear plate 322 may include a second heat absorbing portion 324 that protrudes in a rearward direction from the second rear plate 322 and contacts the second heating element H2. For example, the center of the second heat absorbing portion 324 may be located lower than the center of the first heat absorbing portion 314 by a certain distance d3.

Meanwhile, in addition to contacting the first heating element H1 and the second heating element H2, the vapor chamber 300 does not contact any element located on the PCB(P), thereby smoothly performing the above-described processes of evaporating and condensing the fluid. To this end, the shape of the vapor chamber 300 may be formed by avoiding an avoidance target areas (C: C1, C2, C3, C4, C5) that is an area adjacent to the vapor chamber 300 as an area where devices mounted on the PCB(P) are located.

For example, the lower side of the first vapor chamber 310 may be spaced upward from a first avoidance target area C1. For example, a part of the upper side of the first vapor chamber 310 may be spaced downward from a second avoidance target area C2 and a third avoidance target area C3. For example, a part of the left side of the second vapor chamber 320 may be spaced apart to the right from a fourth avoidance target area C4, and a part of the left side of the second vapor chamber 320 may be recessed to the right to surround a part of a fifth avoidance target area C5.

In addition, the first vapor chamber 310 and the second vapor chamber 320 may be coupled to each other by welding or brazing to form a coupling portion 301. At least a part of the coupling portion 301 may extend in a direction intersecting the up-down direction.

In this case, the coupling portion 301 may include a first part 301a, a second part 301b, and a third part 301c. The lower end of the first part 301a may be connected to the lower side of the first vapor chamber 310 and the right side of the second vapor chamber 320. The lower end of the second part 301b may be connected to the upper end of the first part 301a. The lower end of the third part 301c may be connected to the upper end of the second part 301b, and the upper end of the third part 301c may be connected to the upper side of the first vapor chamber 310 and the upper side of the second vapor chamber 320.

For example, the first part 301a may be inclined upward by a third angle (theta 3) with respect to the virtual horizontal line HL parallel to the left-right direction. In addition, the second part 301b may be inclined upward by a fourth angle (theta 4) with respect to the horizontal line HL. Here, the fourth angle (theta 4) may be larger than the third angle (theta 3). In other words, the inclination of the second part 301b may be larger than the inclination of the first part 301a. The third part 301c may be formed in an up-down direction and may be orthogonal to the horizontal line HL.

Due to the shapes of the first part 301a, the second part 301b, and the third part 301c, the evaporated fluid can easily move upward. In addition, as each of the first part 301a, the second part 301b, and the third part 301c is provided in a straight section, these may be more advantageous to secure the size of the first space S1 in which the first fluid FL convects than when they are formed to be curved toward the first vapor chamber 310, and may be more advantageous in terms of flow characteristics of the first fluid FL1 toward the upper side in the first space S1 than when they are formed to be curved toward the second vapor chamber 320.

At this time, the first vapor chamber 310 may include a first wick 315 that is coupled to the coupling portion 301 in the first space S1 of the first vapor chamber 310, and extends along the coupling portion 301. In addition, the second vapor chamber 320 may include a second wick 325 that is coupled to the coupling portion 301 in the second space S2 of the second vapor chamber 320, and extends along the coupling portion 301. The first wick 315 and the second wick 325 may face each other with the coupling portion 301 interposed therebetween.

Accordingly, without thermal interference such as heat conduction through the coupling portion 301, the evaporation process of the first fluid FL1 performed in the first heat absorbing portion 314 and the condensation process of the first fluid FL1 performed while being adjacent to the upper end of the first vapor chamber 310, or the evaporation process of the second fluid FL2 performed in the second heat absorbing portion 324 and the condensation process of the second fluid FL2 performed while being adjacent to the upper end of the second vapor chamber 320 can be performed smoothly.

Figure 22:
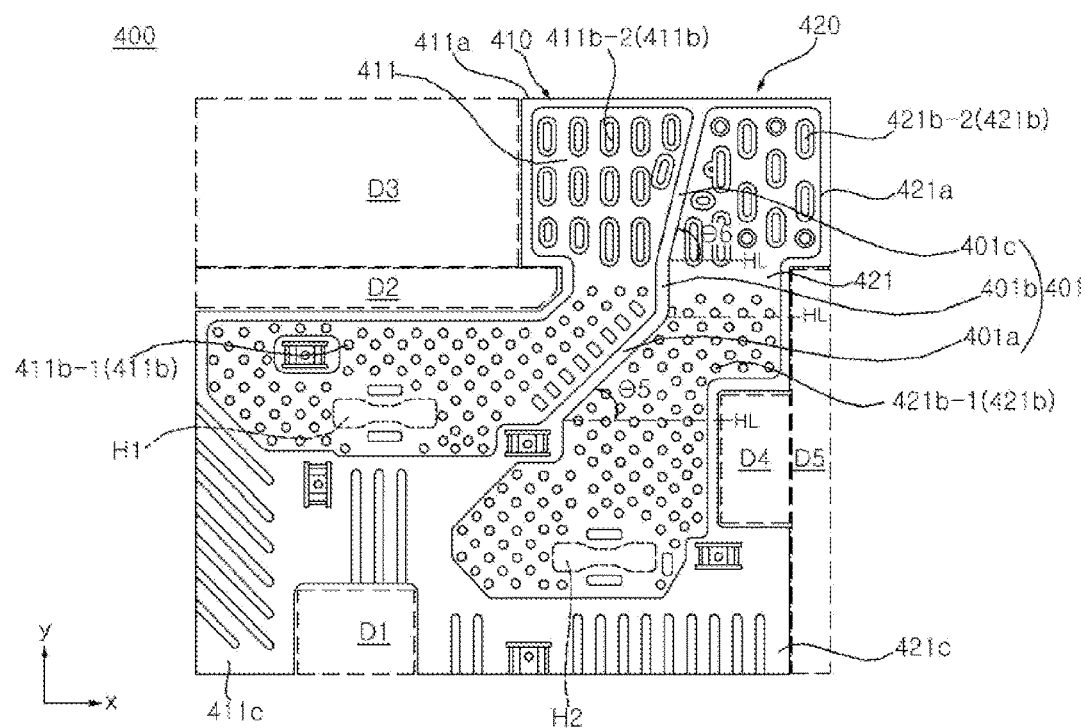
Figure 23:
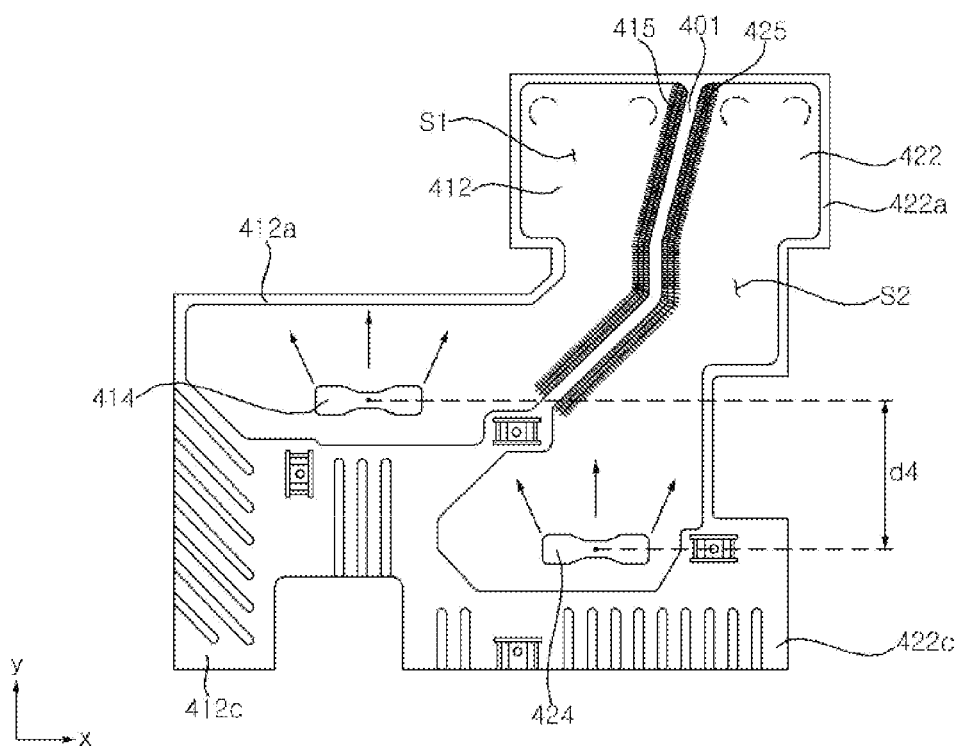

Referring to FIGS. 22 and 23, the vapor chamber 400 contacts the first heating element H1 and the second heating element H2 to dissipate heat of the first heating element H1 and the second heating element H2. Specifically, the vapor chamber 400 may include a first vapor chamber 410 having a rear surface in contact with the first heating element H1 and a second vapor chamber 420 having a rear surface in contact with the second heating element H2.

The first vapor chamber 410 may include a first front plate 411 forming a front surface and a first rear plate 412 forming a rear surface. A first front flange 411a formed along the circumference of the first front plate 411 and a first rear flange 412a formed along the circumference of the first rear plate 312 may be coupled to each other. In addition, a first front fin 411c extending outwardly from the first front flange 411a and a first rear fin 412c extending outwardly from the first rear flange 412a may come into close contact with each other.

The second vapor chamber 420 may include a second front plate 421 forming a front surface and a second rear plate 422 forming a rear surface. A second front flange 421a formed along the circumference of the second front plate 421 and a second rear flange 422a formed along the circumference of the second rear plate 422 may be coupled to each other. In addition, a second front pin 421c extending outwardly from the second front flange 421a and a second rear pin 422c extending outwardly from the second rear flange 422a may come into close contact with each other.

In this case, the first front pin 411c and the second front pin 421c may be formed as one body. In addition, the first rear fin 412c and the second rear fin 422c may be formed as one body. Meanwhile, the first vapor chamber 410 and the second vapor chamber 420 may be coupled to each other by welding or brazing to form a coupling portion 401.

A plurality of first recessed portions 411b may be formed on the front surface of the first front plate 411, and as the plurality of first recessed portions 411b come into contact with the first rear plate 412, a first space S1 containing the first fluid FL1 may be formed between the first front plate 411 and the first rear plate 412. In addition, the first rear plate 412 may include a first heat absorbing portion 414 that protrudes in a rearward direction from the first rear plate 412 and contacts the first heating element H1.

In this case, the plurality of first recessed portions 411b may include a first-first recessed portion 411b-1 having a circular cross section and a first-second recessed portion 411b-2 having an elliptical or rectangular cross section. For example, the first-second recessed portion 411b-2 may be located above the first-first recessed portion 411b-1. For example, the first-second recessed portion 411b-2 may be formed to be long in the up-down direction. Meanwhile, the plurality of first recessed portions 411b may further include recessed portions of various shapes, in addition to the recessed portions having a circular, elliptical, or rectangular cross-section. Accordingly, the flow path of the first space S1 or the first fluid FL1 is adjusted in correspondence with the shape of the first vapor chamber 410, so that the above-described processes of evaporation and condensation of the first fluid FL1 can be more smoothly performed.

A plurality of second recessed portions 421b may be formed on the front surface of the second front plate 421, and as the plurality of second recessed portions 421b come into contact with the second rear plate 422, a second space S2 containing the second fluid FL2 may be formed between the second front plate 421 and the second rear plate 422. In addition, the second rear plate 422 may include a second heat absorbing portion 424 that protrudes in a rearward direction from the second rear plate 422 and contacts the second heating element H2. For example, the center of the second heat absorbing portion 424 may be located lower than the center of the first heat absorbing portion 414 by a certain distance d4.

In this case, the plurality of second recessed portions 421b may include a second-first recessed portion 421b-1 having a circular cross section and a second-second recessed portion 421b-2 having an elliptical or rectangular cross section. For example, the second-second recessed portion 421b-2 may be located above the second-first recessed portion 421b-1. For example, the second-second recessed portion 421b-2 may be formed long in the up-down direction. Meanwhile, the plurality of second recessed portions 421b may further include recessed portions of various shapes, in addition to a recessed portion having a circular, elliptical, or rectangular cross-section. Accordingly, the flow path of the second space S2 or the second fluid FL2 is adjusted in correspondence with the shape of the second vapor chamber 420, so that the above-described processes of evaporation and condensation of the second fluid FL2 can be more smoothly performed.

Meanwhile, in addition to contacting the first heating element H1 and the second heating element H2, the vapor chamber 300 does not contact any element located on the PCB(P), thereby smoothly performing the above-described processes of evaporating and condensing the fluid. To this end, the shape of the vapor chamber 400 may be formed by avoiding an avoidance target areas (D: D1, D2, D3, D4, D5) that is an area adjacent to the vapor chamber 400 as an area where devices mounted on the PCB(P) are located.

In addition, the first vapor chamber 410 and the second vapor chamber 420 may be coupled to each other by welding or brazing to form a coupling portion 401. At least a part of the coupling portion 401 may extend in a direction intersecting the up-down direction.

In this case, the coupling portion 401 may include a first part 401a, a second part 401b, and a third part 401c. The lower end of the first part 401a may be located adjacent to the center of the vapor chamber 400. The lower end of the second part 401b may be connected to the upper end of the first part 401a. The lower end of the third part 401c may be connected to the upper end of the second part 401b, and the upper end of the third part 401c may be connected to the upper side of the first vapor chamber 410 and the upper side of the second vapor chamber 420.

For example, the first part 401a may be formed inclined upward by a fifth angle (theta 5) with respect to the virtual horizontal line HL parallel to the left-right direction. The second part 401b may be formed in the up-down direction and may be orthogonal to the horizontal line HL. The third part 401c may be formed inclined upward by a sixth angle (theta 6) with respect to the horizontal line HL. Here, the sixth angle (theta 6) may be larger than the fifth angle (theta 5). In other words, the inclination of the third part 401c may be larger than the inclination of the first part 401a.

Due to the shapes of the first part 401a, the second part 401b, and the third part 401c, the evaporated fluid can easily move upward.

Meanwhile, the total size of the first avoidance target area D1, the second avoidance target area D2, and the third avoidance target area D3 adjacent to the first vapor chamber 410 may be larger than the total size of the fourth avoidance target area D4 and the fifth avoidance target area D5 adjacent to the second vapor chamber 420. At this time, the third part 401c may be formed inclined toward the second vapor chamber 420 by a certain angle with respect to a virtual vertical line (not shown) parallel to the up-down direction. In this case, the size of the first space S1 in which the first fluid FL1 convects may be equal to or larger than the size of the second space S2 in which the second fluid FL2 convects. It is preferable that the shape and disposition of the third part 401c is applied when the heat value of the first heating element H1 is equal to or larger than the heat value of the second heating element H2.

Meanwhile, the first vapor chamber 410 may include a first wick 415 that is coupled to the coupling portion 401 in the first space S1 of the first vapor chamber 410, and extends along the coupling portion 401. In addition, the second vapor chamber 420 may include a second wick 425 that is coupled to the coupling portion 401 in the second space S2 of the second vapor chamber 420, and extends along the coupling portion 401. The first wick 415 and the second wick 425 may face each other with the coupling portion 401 interposed therebetween.

Accordingly, without thermal interference such as heat conduction through the coupling portion 401, the evaporation process of the first fluid FL1 performed in the first heat absorbing portion 414 and the condensation process of the first fluid FL1 performed while being adjacent to the upper end of the first vapor chamber 410, or the evaporation process of the second fluid FL2 performed in the second heat absorbing portion 424 and the condensation process of the second fluid FL2 performed while being adjacent to the upper end of the second vapor chamber 420 can be performed smoothly.

According to an aspect of the present disclosure, there is provided a display device including: a display panel; a frame located in a rearward direction of the display panel; a PCB which is coupled to the frame, and has a first heating element and a second heating element that are spaced apart from each other; and a vapor chamber in contact with the first heating element and the second heating element, wherein the vapor chamber includes: a first vapor chamber which contacts the first heating element, contains a first fluid, and provides a first space in which the first fluid convects; a second vapor chamber which contacts the second heating element, contains a second fluid, and provides a second space in which the second fluid convects; a coupling portion which partitions the first space and the second space at between the first vapor chamber and the second vapor chamber; a first wick which is adjacent to the coupling portion inside the first vapor chamber, and extends along the coupling portion, and through which the first fluid moves; and a second wick which is adjacent to the coupling portion inside the second vapor chamber, and extends along the coupling portion, and through which a flow path of the second fluid moves.

According to another aspect of the present disclosure, the first fluid convects while evaporating into a gas phase or condensing into a liquid phase in the first space, and the second fluid convects while evaporating into a gas phase or condensing into a liquid phase in the second space.

According to another aspect of the present disclosure, the display device further includes a space which is adjacent to the coupling portion, and formed between the first vapor chamber and the second vapor chamber, and the first wick and the second wick face each other with the coupling portion interposed therebetween.

According to another aspect of the present disclosure, the PCB further includes a protruding element which is spaced apart from the first heating element and the second heating element, and protrudes from the PCB, and the first vapor chamber and the second vapor chamber are spaced apart from the protruding element.

According to another aspect of the present disclosure, at least a part of the coupling portion extends in a direction intersecting an up-down direction.

According to another aspect of the present disclosure, the coupling portion is formed inclined toward the second vapor chamber at a certain angle with respect to a virtual vertical line parallel to an up-down direction, when a heat value of the first heating element is larger than a heat value of the second heating element, and is formed inclined toward the first vapor chamber at a certain angle with respect to the vertical line, when the heat value of the first heating element is smaller than the heat value of the second heating element.

According to another aspect of the present disclosure, the first vapor chamber and the second vapor chamber are spaced apart from each other in a left-right direction, the coupling portion further includes: a first part inclined upward at a first angle with respect to a virtual horizontal line parallel to a left-right direction; and a second part which is connected to the first part, and formed inclined upward at a second angle larger than the first angle with respect to the horizontal line, wherein the second part is located in an upper side of the first part.

According to another aspect of the present disclosure, the first vapor chamber further includes a first heat absorbing portion which protrudes from the first vapor chamber toward the PCB, and contacts the first heating element, the second vapor chamber further includes a second heat absorbing portion which protrudes from the second vapor chamber toward the PCB, and contacts the second heating element, the first vapor chamber is spaced apart from the PCB in a portion excluding the first heat absorbing portion, and the second vapor chamber is spaced apart from the PCB in a portion excluding the second heat absorbing portion.

According to another aspect of the present disclosure, a location of the first heat absorbing portion and a location of the second heat absorbing portion are different in an up-down direction.

According to another aspect of the present disclosure, a heat value of the first heating element is larger than a heat value of the second heating element, and an area of the first vapor chamber is larger than an area of the second vapor chamber, in proportion to a difference between the heat value of the first heating element and the heat value of the second heating element.

According to another aspect of the present disclosure, the first vapor chamber and the second vapor chamber are spaced apart from each other in a left-right direction, and the vapor chamber further includes a heat sink which extends in a left-right direction, is adjacent to an upper end of the first vapor chamber and coupled to the first vapor chamber, and is adjacent to an upper end of the second vapor chamber and coupled to the second vapor chamber.

According to another aspect of the present disclosure, the heat sink further includes a plurality of fins protruding from the heat sink.

According to another aspect of the present disclosure, the first vapor chamber further includes: a first rear plate having a first heat absorbing portion in contact with the first heating element; and a first front plate coupled to the first rear plate in a forward direction of the first rear plate, the first front plate includes a plurality of first recessed portions which are recessed in a rearward direction from the first front plate and in contact with the first rear plate, the first space is formed between the first rear plate and the first front plate.

According to another aspect of the present disclosure, the plurality of first recessed portions further include: a first-first recessed portion having a circular cross section; and a first-second recessed portion having an elliptical cross section, and the first-second recessed portion is located in an upper side of the first-first recessed portion.

According to another aspect of the present disclosure, the display device further includes a porous first sheet located in the first space, the first heat absorbing portion is spaced upward from a lower end of the first vapor chamber, and the first sheet has one end adjacent to the lower end of the first vapor chamber, and has the other end adjacent to an upper end of the first heat absorbing portion.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a display panel;
a frame located in a rearward direction of the display panel;
a printed circuit board (PCB) which is coupled to the frame, and has a first heating element and a second heating element that are spaced apart from each other; and
a vapor chamber in contact with the first heating element and the second heating element,
wherein the vapor chamber comprises:
a first vapor chamber which contacts the first heating element, contains a first fluid, and provides a first space in which the first fluid convects;
a second vapor chamber which contacts the second heating element, contains a second fluid, and provides a second space in which the second fluid convects;
a coupling portion which partitions the first space and the second space at between the first vapor chamber and the second vapor chamber; and
a heat sink coupled to the first vapor chamber and the second vapor chamber, positioned outside of both the first vapor chamber and the second vapor chamber, and connecting the first vapor chamber and the second vapor chamber.

2. The display device of claim 1, wherein the first fluid convects while evaporating into a gas phase or condensing into a liquid phase in the first space,
wherein the second fluid convects while evaporating into a gas phase or condensing into a liquid phase in the second space.

3. The display device of claim 1, further comprising:
a first wick which is adjacent to the coupling portion inside the first vapor chamber, and extends along the coupling portion, and through which the first fluid moves; and
a second wick which is adjacent to the coupling portion inside the second vapor chamber, and extends along the coupling portion, and through which a flow path of the second fluid moves
wherein the first wick and the second wick face each other with the coupling portion interposed therebetween.

4. The display device of claim 1, wherein the PCB further comprises a protruding element which is spaced apart from the first heating element and the second heating element, and protrudes from the PCB,
wherein the first vapor chamber and the second vapor chamber are spaced apart from the protruding element.

5. The display device of claim 4, wherein at least a part of the coupling portion extends in a direction intersecting an up-down direction.

6. The display device of claim 5, wherein the coupling portion is formed inclined toward the second vapor chamber at a certain angle with respect to a virtual vertical line parallel to an up-down direction, when a heat value of the first heating element is larger than a heat value of the second heating element, and
is formed inclined toward the first vapor chamber at a certain angle with respect to the vertical line, when the heat value of the first heating element is smaller than the heat value of the second heating element.

7. The display device of claim 5, wherein the first vapor chamber and the second vapor chamber are spaced apart from each other in a left-right direction,
wherein the coupling portion further comprises:
a first part inclined upward at a first angle with respect to a virtual horizontal line parallel to a left-right direction; and
a second part which is connected to the first part, and formed inclined upward at a second angle larger than the first angle with respect to the horizontal line,
wherein the second part is located in an upper side of the first part.

8. The display device of claim 1, wherein the first vapor chamber further comprises a first heat absorbing portion which protrudes from the first vapor chamber toward the PCB, and contacts the first heating element,
wherein the second vapor chamber further comprises a second heat absorbing portion which protrudes from the second vapor chamber toward the PCB, and contacts the second heating element,
wherein the first vapor chamber is spaced apart from the PCB in a portion excluding the first heat absorbing portion, and
wherein the second vapor chamber is spaced apart from the PCB in a portion excluding the second heat absorbing portion.

9. The display device of claim 8, wherein a location of the first heat absorbing portion and a location of the second heat absorbing portion are different in an up-down direction.

10. The display device of claim 1, wherein a heat value of the first heating element is larger than a heat value of the second heating element, and
wherein an area of the first vapor chamber is larger than an area of the second vapor chamber, in proportion to a difference between the heat value of the first heating element and the heat value of the second heating element.

11. The display device of claim 1, wherein the first vapor chamber and the second vapor chamber are spaced apart from each other in a left-right direction, wherein the heat sink extends in a left-right direction, is adjacent to an upper end of the first vapor chamber, and is adjacent to an upper end of the second vapor chamber.

12. The display device of claim 1, wherein the heat sink further comprises a plurality of fins protruding from the heat sink.

13. The display device of claim 1, wherein the first vapor chamber further comprises:
 a first rear plate having a first heat absorbing portion in contact with the first heating element; and
 a first front plate coupled to the first rear plate in a forward direction of the first rear plate,
 wherein the first front plate comprises a plurality of first recessed portions which are recessed in a rearward direction from the first front plate and in contact with the first rear plate, and
 wherein the first space is formed between the first rear plate and the first front plate.

14. The display device of claim 13, wherein the plurality of first recessed portions further comprise:
 a first-first recessed portion having a circular cross section; and
 a first-second recessed portion having an elliptical cross section, and
 wherein the first-second recessed portion is located in an upper side of the first-first recessed portion.

15. The display device of claim 13, further comprising a porous first sheet located in the first space,
 wherein the first heat absorbing portion is spaced upward from a lower end of the first vapor chamber, and
 wherein the first sheet has one end adjacent to the lower end of the first vapor chamber, and has the other end adjacent to an upper end of the first heat absorbing portion.

16. A display device comprising:
 a display panel;
 a frame located in a rearward direction of the display panel;
 a printed circuit board (PCB) which is coupled to the frame, and has a first heating element and a second heating element that are spaced apart from each other; and
 a vapor chamber in contact with the first heating element and the second heating element,
 wherein the vapor chamber comprises:
 a first vapor chamber which contacts the first heating element, contains a first fluid, and provides a first space in which the first fluid convects;
 a second vapor chamber which contacts the second heating element, contains a second fluid, and provides a second space in which the second fluid convects; and
 a coupling portion which partitions the first space and the second space at between the first vapor chamber and the second vapor chamber,
 wherein the first vapor chamber further comprises a first heat absorbing portion which protrudes from the first vapor chamber toward the PCB, and contacts the first heating element,
 wherein the second vapor chamber further comprises a second heat absorbing portion which protrudes from the second vapor chamber toward the PCB, and contacts the second heating element,
 wherein the first vapor chamber is spaced apart from the PCB in a portion excluding the first heat absorbing portion, and
 wherein the second vapor chamber is spaced apart from the PCB in a portion excluding the second heat absorbing portion.

17. The display device of claim 16, wherein a location of the first heat absorbing portion and a location of the second heat absorbing portion are different in an up-down direction.

18. A display device comprising:
 a display panel;
 a frame located in a rearward direction of the display panel;
 a printed circuit board (PCB) which is coupled to the frame, and has a first heating element and a second heating element that are spaced apart from each other; and
 a vapor chamber in contact with the first heating element and the second heating element,
 wherein the vapor chamber comprises:
 a first vapor chamber which contacts the first heating element, contains a first fluid, and provides a first space in which the first fluid convects;
 a second vapor chamber which contacts the second heating element, contains a second fluid, and provides a second space in which the second fluid convects; and
 a coupling portion which partitions the first space and the second space at between the first vapor chamber and the second vapor chamber,
 wherein the first vapor chamber further comprises:
 a first rear plate having a first heat absorbing portion in contact with the first heating element; and
 a first front plate coupled to the first rear plate in a forward direction of the first rear plate,
 wherein the first front plate comprises a plurality of first recessed portions which are recessed in a rearward direction from the first front plate and in contact with the first rear plate, and
 wherein the first space is formed between the first rear plate and the first front plate.

19. The display device of claim 18, wherein the plurality of first recessed portions further comprise:
 a first-first recessed portion having a circular cross section; and
 a first-second recessed portion having an elliptical cross section, and
 wherein the first-second recessed portion is located in an upper side of the first-first recessed portion.

20. The display device of claim 18, further comprising a porous first sheet located in the first space,
 wherein the first heat absorbing portion is spaced upward from a lower end of the first vapor chamber, and
 wherein the first sheet has one end adjacent to the lower end of the first vapor chamber, and has the other end adjacent to an upper end of the first heat absorbing portion.

* * * * *